(12) United States Patent
Hasegawa et al.

(10) Patent No.: US 7,918,982 B2
(45) Date of Patent: Apr. 5, 2011

(54) PRODUCTION DEVICE AND PRODUCTION METHOD FOR CONDUCTIVE NANO-WIRE

(75) Inventors: Hiroyuki Hasegawa, Koganei (JP); Tohru Kubota, Koganei (JP); Shinro Mashiko, Koganei (JP)

(73) Assignee: National Institute of Information and Communications Technology Incorporated Administrative Agency, Tokyo (JP)

( * ) Notice: Subject to any disclaimer, the term of this patent is extended or adjusted under 35 U.S.C. 154(b) by 132 days.

(21) Appl. No.: 11/961,445

(22) Filed: Dec. 20, 2007

(65) Prior Publication Data

US 2008/0182388 A1    Jul. 31, 2008

Related U.S. Application Data

(62) Division of application No. 10/506,668, filed as application No. PCT/JP03/02713 on Mar. 7, 2003, now Pat. No. 7,351,313.

(30) Foreign Application Priority Data

Mar. 8, 2002  (JP) .................................. 2002-063400
Mar. 8, 2002  (JP) .................................. 2002-063515

(51) Int. Cl.
*C25D 5/02*  (2006.01)
*C25B 3/00*  (2006.01)
(52) U.S. Cl. ..................... 205/114; 205/424; 205/426
(58) Field of Classification Search .............. 205/76, 205/77, 424, 426
See application file for complete search history.

(56) References Cited

U.S. PATENT DOCUMENTS

| | | | | |
|---|---|---|---|---|
| 4,624,756 A | * | 11/1986 | Matsuda et al. | 205/433 |
| 4,986,886 A | * | 1/1991 | Wei et al. | 205/419 |
| 6,297,063 B1 | | 10/2001 | Brown et al. | |
| 6,879,143 B2 | * | 4/2005 | Nagahara et al. | 324/71.1 |
| 6,892,432 B2 | | 5/2005 | Nakayama et al. | |
| 6,949,762 B2 | * | 9/2005 | Ong et al. | 257/40 |
| 2001/0018515 A1 | | 8/2001 | Kobuke et al. | |

FOREIGN PATENT DOCUMENTS

| | | |
|---|---|---|
| JP | 2001-207288 | 7/2001 |
| WO | 93/25003 | 9/1993 |
| WO | 93/22480 | 11/1993 |

OTHER PUBLICATIONS

Bezryadin et al., "Electrostatic Trapping of Single Conducting Nanoparticles Between Nanoelectrodes", Appl. Phys. Lett., vol. 71, No. 9, Sep. 1, 1997, pp. 1273-1275.*

(Continued)

*Primary Examiner* — Edna Wong

(74) *Attorney, Agent, or Firm* — Westerman, Hattori, Daniels & Adrian, LLP

(57) ABSTRACT

The object of the disclosure is to provide a nano-scale molecular assembly such as a conductive nano-wire. Specifically, there is provided an electrochemical apparatus for forming a molecular assembly, including two electrodes and an electrochemical cell holding an electrolytic solution and the two electrodes, wherein the gap between the two electrodes is from 1 nm to 100 μm, by allowing the electrochemical cell to hold an electrolytic solution containing molecules that is to constitute the molecular assembly, and applying a voltage across the two electrodes in the state wherein the electrolyte and the two electrodes are in contact.

2 Claims, 25 Drawing Sheets

OTHER PUBLICATIONS

Doulakas et al., "Recovery of Cu, Pb, Cd and Zn from Synthetic Mixture by Selective Electrodeposition in Chloride Solution", Electrochimica Acta, vol. 46 (no month, 2000), pp. 349-356.*

Li et al., "Molecular Detection Based on Conductance Quantization of Nanowires", Appl. Phys. Lett., vol. 76, No. 10, Mar. 6, 2000, pp. 1333-1335.*

Hasegawa et al., "Molecular Conductors Based on Axially Substituted Phthalocyanines and Organic Cations", Synthetic Metals (no month, 1997), vol. 86, pp. 1895-1896.*

Hasegawa et al., "A Highly Conducting Partially Oxidized Salt of Axially Substituted Phthalocyanine. Structure and Physical Properties of TPP[Co(Pc)(CN)2]2 {TPP=tetraphenylphosphonium, [Co(Pc)(CN)2] =dicyano(phthalocyaninato)cobalt(III)}", J. Mater. Chem. (no month, 1998), vol. 8, No. 7, pp. 1567-1570.*

Hermanson et al., "Dielectrophoretic Assembly of Electrically Functional Microwires from Nanoparticle Suspensions", Science, Nov. 2, 2001, vol. 294, pp. 1082-1086.*

Joachim et al., "Electronics Using Hybrid-Molecular and Mono-Molecular Devices", Nature, vol. 408, Nov. 30, 2000, pp. 541-548.*

Tans et al., "Deposition and Atomic Force Microscopy of Individual Phthalocyanine Polymers Between Nanofabricated Electrodes", J. Vac. Soc. Technol. B 15(3), May/Jun. 1997.*

H. Hasegawa et al. "Journal of Materials Chemistry" vol. 8, No. 7, pp. 1567-1570, Jul. 1998.

L. Ruhlmann et al. "Journal of the American Chemical Society" vol. 121, No. 28, pp. 6664-6667, Jul. 21, 1999.

Notification of Transmittal of Translation of the International Preliminary Examination Report dated Oct. 28, 2004, and received by our foreign associate on Nov. 1, 2004.

* cited by examiner (a)

(b)

(c)

(a)

(b)

(c)

(a)

(b)

(a)

(b)

(a)

(b)

(a)

(b)

(c)

PRODUCTION DEVICE AND PRODUCTION METHOD FOR CONDUCTIVE NANO-WIRE

CROSS-REFERENCE TO RELATED APPLICATIONS

This application is a divisional of U.S. application Ser. No. 10/506,668 filed in Sep. 7, 2004, now U.S. Pat. No. 7,351,313 issued on Apr. 1, 2008, which is a 371 of PCT/JP03/02713 filed on Mar. 7, 2003.

TECHNICAL FIELD

The present invention relates to a method and an apparatus of manufacturing a molecular assembly such as a nano-wire and a needle crystal. More specifically, the present invention relates to an electrochemical apparatus for manufacturing a nano-level minute molecular assembly such as a method of manufacturing a conductive nano-wire and a nano-level needle crystal, wherein an electrolytic crystal growing method is applied to the manufacture of a molecular assembly, and a method of manufacturing the electrochemical apparatus.

BACKGROUND ART

As molecular-assembly growing methods, especially methods of growing a single-molecular assembly, a large number of methods, such as a liquid-phase epitaxial (LPE) method, a molecular-beam epitaxial (MBE) method, a chemical vapor transport (CVT) method, and a chemical vapor deposition (CVD) method, have been proposed. The use of these methods enables to obtain a relatively large single-molecular assembly or a single-molecular assembly film. A method of growing a crystal by an electrolytic method, which is a crystal-growing method utilizing an electrolytic reaction, has also been known (e.g., Lectures on Experimental Chemistry 12, Functionality of Substances, 4th Edition, pp. 40-45, Maruzen).

In Japanese Patent Application Laid-Open No. 6-321686, a method of manufacturing a metallic-atom-doped carbon cluster compound, characterized in that a single-molecular assembly of the compound is grown in an organic solvent in which an organic salt of a metal and carbon clusters are dissolved in a cathode side using an electrolytic molecular-assembly growing method.

When a molecular nano-wire is manufactured, the manufacture using a molecular vapor deposition method of a molecular beam method in ultra-high vacuum has been known. A method of manufacturing a molecular nano-wire by arranging dendrimers or closed-shell molecules, and a method of manufacturing a carbon nano-tube have also been known.

However, conventional electrolytic methods aim at forming crystals as large as possible, but not forming nano-scale molecular assemblies. Also since conventional electrolytic methods aim at forming crystals of a milli-scale or larger, they have a problem that it is difficult to form high-purity crystals. The carbon cluster formed using the method of forming a carbon cluster described in Japanese Patent Application Laid-Open No. 6-321686 also has the size of millimeter units, and is not controlled at a molecular level. The invention described in the same patent aims at forming a larger single-molecular assembly, and not at forming a nano-scale molecular assembly as in the present invention. As a result, although the invention described in the same patent uses an electrolytic crystal growing method to form a molecular assembly, it does not use electrodes with a narrow gap between the electrodes, and only a molecular assembly of a millimeter level or a sub-millimeter level can be formed.

Also when a nano-wire is manufactured using a molecular vapor deposition method or a molecular beam method under ultra-high vacuum, the vacuum apparatus is expensive and complicated, and a large-scale apparatus is required. There is also a problem of requiring labor even for producing a vacuum. In a molecular vapor deposition method or a molecular beam method under ultra-high vacuum, there is a problem that a functional group to cause interaction such as hydrogen bonds must be introduced between molecules or between molecules and the substrate in order to fix molecules with each other or molecules with the substrate. When a nano-wire is formed in vacuum, there was a problem that the properties of the nano-wire change due to oxidation or the like when the vacuum is broken. Since conventional nano-wires (molecular assemblies) were assemblies of molecules that had a closed-shell structure (a structure having two electrons in a HOMO (highest occupied molecular orbital), and no molecules that had SOMO (semi-occupied molecular orbital), there was a problem that only nano-wires that had low electron mobility and poor conductivity.

Furthermore, the providing of electronic circuits having nano-scale or sub-micro-scale functional sites, and electronic devices using such electronic circuits has been demanded.

DISCLOSURE OF THE INVENTION

At least one of the above-described problems are solved by the invention described below.

(1) An electrochemical apparatus for producing a molecular assembly including:
  two electrodes, and
  an electrochemical cell for holding an electrolytic solution and the two electrodes, wherein
  the gap between the two electrodes is from 1 nm to 100 μm, and
  the molecular assembly is produced by allowing the electrochemical cell to hold an electrolytic solution containing molecules that is to constitute the molecular assembly, and applying a voltage across the two electrodes in the state wherein the electrolytic solution and the two electrodes are in contact. By thus miniaturizing the gap between electrodes, a minute molecular assembly such as a conductive nano-wire can be formed.

(2) The electrochemical apparatus for producing a molecular assembly according to the above (1), further including:
  a voltage control device for controlling the voltage applied across the two electrodes, and/or a current control device for controlling the current supplied to the two electrodes, characterized in that the two electrodes are formed on a substrate.

(3) An electrochemical apparatus for producing a molecular assembly including:
  two electrodes facing each other formed on a substrate,
  an electrochemical cell for holding an electrolytic solution and the substrate, and
  a voltage control device connected to the two electrodes for controlling the voltage applied across the two electrodes, wherein
  the electrochemical cell comprises:
  an electrolytic solution holder section for holding the electrolytic solution, and
  a substrate plug section for plugging the substrate,
  the two electrodes have respective protrusions located either between both ends of each electrode and extending toward the other electrode, or on one end of each electrode and extending toward the other electrode by bending the each electrode at the one end;

the gap between the closest sites of the two electrodes formed on the substrate is from 1 nm to 100 µm; and the molecular assembly is produced by allowing the electrochemical cell to hold an electrolytic solution containing molecules that is to constitute the molecular assembly, and supplying a current to the two electrodes in the state wherein the electrolytic solution and the two electrodes are in contact.

(4) The electrochemical apparatus for producing a molecular assembly according to the above (3), wherein each end of the protrusions of the two facing electrodes faces each other in parallel, or is tapered as approaching the other protrusion; and the two electrodes have an insulated portion covered with an insulator; and the site of the substrate plug section exposing the substrate when the substrate is plugged in the substrate plug section is covered with an insulator.

(5) An electrochemical apparatus for producing a molecular assembly including:

a substrate, a gate electrode formed on the substrate, an insulating layer covering the gate electrode, two facing electrodes formed on the insulating layer;

an electrochemical cell for holding the electrolytic solution and the substrate; and a voltage control device connected to the gate electrode and two electrodes for controlling the voltages applied across the gate electrode and two electrodes; wherein the electrochemical cell includes:

an electrolytic solution holder section for holding the electrolytic solution, and a substrate plug section for plugging the substrate;

the site of the substrate plug section exposing the substrate when the substrate is plugged in the substrate plug section is covered with an insulator;

the two electrodes have respective protrusions located either between both ends of each electrode and extending toward the other electrode, or on one end of each electrode and extending toward the other electrode by bending the each electrode at the one end;

each end of the protrusions of the two facing electrodes faces each other in parallel, or is tapered as approaching the other protrusion;

the two electrodes have an insulated portion covered with an insulator;

the gap between the closest sites of the two electrodes formed on the substrate is from 1 nm to 100 µm;

the molecular assembly is produced by allowing the electrochemical cell to hold an electrolytic solution containing molecules that is to constitute the molecular assembly, and applying a voltage across the two electrodes in the state wherein the electrolytic solution and the two electrodes are in contact.

(6) A method of fabricating an electrochemical apparatus for forming a molecular assembly, the apparatus including:

two electrodes facing each other formed on a substrate, an electrochemical cell for holding an electrolytic solution and the substrate, and a voltage control device connected to the two electrodes through electrode lines for controlling the voltage applied across the two electrodes, the method including:

a step for forming electrodes having a gap of from 1 nm to 100 µm between them on the substrate, by:

a metallic-film forming step for forming a metallic film on the substrate;

a resist layer forming step for forming a resist layer on the metallic film vapor-deposited in the metallic-film forming step;

a light exposure step for exposing the resist layer formed in the resist layer forming step to a desired pattern;

a developing step for developing the resist layer exposed in the light exposure step; and an etching step for etching the metallic film using the resist layer left after the developing step as a mask; wherein the molecular assembly is produced by allowing the electrochemical cell to hold an electrolytic solution containing molecules that is to constitute the molecular assembly, and applying a voltage across the two electrodes in the state wherein the electrolytic solution and the two electrodes are in contact.

(7) A method of fabricating an electrochemical apparatus for forming a molecular assembly, the apparatus including:

two electrodes facing each other formed on a substrate, an electrochemical cell for holding an electrolytic solution and the substrate, and a voltage control device connected to the two electrodes through electrode lines for controlling the voltage applied across the two electrodes; the method including:

a step for forming electrodes having a gap of from 1 nm to 100 µm between them on the substrate, by:

a metallic-film forming step for forming a metallic film on the substrate;

a resist layer forming step for forming a resist layer on the metallic film vapor-deposited in the metallic-film forming step;

an electron beam radiating step for radiating electron beams onto the resist layer formed in the resist layer forming step to a desired pattern;

a developing step for developing the resist layer irradiated in the electron beam radiating step; and an etching step for etching the metallic film using the resist layer left after the developing step as a mask; wherein the molecular assembly is produced by allowing the electrochemical cell to hold an electrolytic solution containing molecules that is to constitute the molecular assembly, and applying a voltage across the two electrodes in the state wherein the electrolytic solution and the two electrodes are in contact.

(8) A method of fabricating an electrochemical apparatus for forming a molecular assembly, the apparatus including:

two electrodes facing each other formed on a substrate, an electrochemical cell for holding an electrolytic solution and the substrate, and a voltage control device connected to the two electrodes through electrode lines for controlling the voltage applied across the two electrodes; the method including:

a step for forming on the substrate electrodes leaving a gap of from 1 nm to 100 µm; by:

a metallic-film forming step for forming a metallic film on the substrate;

a photoresist layer forming step for forming a photoresist layer on the metallic film vapor-deposited in the metallic-film forming step;

a light exposure step for exposing the photoresist layer formed in the photoresist layer forming step to a desired pattern;

a first developing step for developing the photoresist layer exposed in the light exposure step;

a rough electrode-form forming step for forming a rough form of the electrode on the substrate by the step including a first etching step for etching the metallic film using the photoresist layer left after the first developing step as a mask;

an electron beam resist layer forming step for forming an electron beam resist layer on the rough form of the electrode formed in the rough electrode-form forming step;

an electron beam radiating step for radiating electron beams onto the electron beam resist layer formed in the electron beam resist layer forming step to a desired pattern;

a second developing step for developing the electron beam resist layer irradiated in the electron beam radiating step; and a second etching step for etching the metallic film using the electron beam resist layer left after the second developing step as a mask; wherein the molecular assembly is produced by allowing the electrochemical cell to hold an electrolytic solution containing molecules that is to constitute the molecular assembly, and applying a voltage across the two electrodes in the state wherein the electrolytic solution and the two electrodes are in contact.

(9) A method of forming a molecular assembly to form a molecular assembly by allowing an electrochemical cell to hold an electrolytic solution containing molecules that constitute a molecular assembly, and applying a voltage across the two electrodes in the state wherein the electrolytic solution and the two electrodes are in contact; including:

an electrode adjusting step for adjusting the gap between the two electrodes to from 1 nm to 100 μm;

an electrode mounting step for mounting the two electrodes onto the electrochemical cell;

an electrolytic solution preparing step for dissolving the molecular assembly in an organic solvent;

an electrolytic solution injecting step for injecting the electrolytic solution into the electrochemical cell; and an electrolyzing step for applying an electric current of 1 nA to 1 mA across the two electrodes for a period of 10 days or below to make the potential difference between the two electrodes 10 mV to 20 V.

(10) The method of forming a molecular assembly, wherein the voltage to be applied is a DC voltage or an AC voltage. In this case, the potential difference described in (9) means the maximum voltage.

(11) A molecular assembly having a width between the size of one constituent molecule to 1 μm and a length of 1 nm to 500 μm, and comprising an organic conductor composed of an organic compound having a π-electron system as the constituent molecule. The term constituent molecule used herein means, for example, a phthalocyanine molecule and the like.

(12) The molecular assembly according to the above (11), wherein the conductivity of the molecular assembly is 1 S·cm$^{-1}$ or more. The conductive molecular assembly is a preferable molecular assembly in the present invention.

(13) A method of fabricating a electrically conductive nano-wire containing a molecular assembly of a diameter of 1 nm to 1 μm and a length of 1 nm to 500 μm using an electrolytic solution containing an organic conductor having π-electrons, including:

a step for fabricating the molecular assembly by applying a DC voltage and/or an AC voltage having the maximum potential difference of 10 mV to 20 V for 1 second to 10 days across the two electrodes having a gap between the closest sites of the two electrodes of from 1 nm to 100 μm.

(14) The method of fabricating a electrically conductive nano-wire according to the above (13), wherein the organic conductor having π-electrons is a cyanocobalt complex of phthalocyanine.

(15) The method of fabricating a electrically conductive nano-wire according to the above (13), wherein the organic conductor having π-electrons is tetraphenyl phosphonium dicyanocobalt (III) phthalocyanine, and the conductivity of the molecular assembly is 1 S·cm$^{-1}$ or more.

(16) A method of fabricating an electrically conductive nano-wire using an electrochemical apparatus including:

two electrodes facing each other formed on a substrate, an electrochemical cell for holding an electrolytic solution and the substrate, and a voltage control device connected to the two electrodes, for controlling a voltage applied to the two electrodes; wherein the electrochemical cell includes:

an electrolytic solution holder section for holding the electrolytic solution, and a substrate plug section for plugging the substrate;

the site of the substrate plug section exposing the substrate when the substrate is plugged in the substrate plug section is covered with an insulator;

the two electrodes have respective protrusions located either between both ends of each electrode and extending toward the other electrode, or on one end of each electrode and extending toward the other electrode by bending the each electrode at the one end;

each end of the protrusions of the two facing electrodes faces each other in parallel, or is tapered as approaching the other protrusion;

the two electrodes have an insulated portion covered with an insulator; and the gap between the closest sites of the two electrodes formed on the substrate is from 1 nm to 100 μm;

the method including a step for forming a molecular assembly having a diameter of 1 nm to 1 μm and a length of 1 nm to 500 μm, by allowing the electrochemical cell to hold an electrolytic solution containing tetraphenyl phosphonium dicyanocobalt (III) phthalocyanine, which are molecules that are to constitute a molecular assembly, and acetonitrile; and applying a DC voltage and/or an AC voltage having the maximum potential difference across two electrodes of 10 mV to 20 V across the two electrodes for 0.01 seconds to 10 days in the state wherein the electrolytic solution and the two electrodes are in contact.

(17) A method of fabricating an electronic circuit including:

a step for exposing the gap of an electronic circuit ranging from 1 nm to 100 μm to an electrolytic solution containing an organic conductor having π-electrons; and a step for applying a voltage across the electronic circuit, and exposing the gap using a conductive molecular assembly produced in the gap.

(18) A method of fabricating an electronic circuit having a connecting portion of a conductive molecular assembly, including a step for exposing an electronic circuit having a gap of from 1 nm to 100 μm to be filled by the conductive molecular assembly to an electrolytic solution containing an organic conductor having π-electrons; and a step for filling the gap using the conductive molecular assembly produced in the gap.

(19) A method of fabricating an electronic circuit having a connecting portion of a conductive molecular assembly, including a step for exposing an electronic circuit having a gap with the distance of one to ten molecules to be filled by the conductive molecular assembly to an electrolytic solution containing an organic conductor having π-electrons; and a step for filling the gap using the conductive molecular assembly produced in the gap.

BRIEF DESCRIPTION OF THE DRAWINGS

FIG. 5 (a) being a plan and FIG. 5 (b) being a sectional view;

FIG. 6 (a) being a plan and FIG. 6 (b) being a sectional view;

FIG. 7 (a) being a plan and FIG. 7 (b) being a sectional view;

FIG. 16 (a) and FIG. 16 (b) are 80,000× and 1,100×SEM photos, respectively;

BEST MODE FOR CARRYING OUT THE INVENTION

Electrochemical Apparatus

Figure 1:
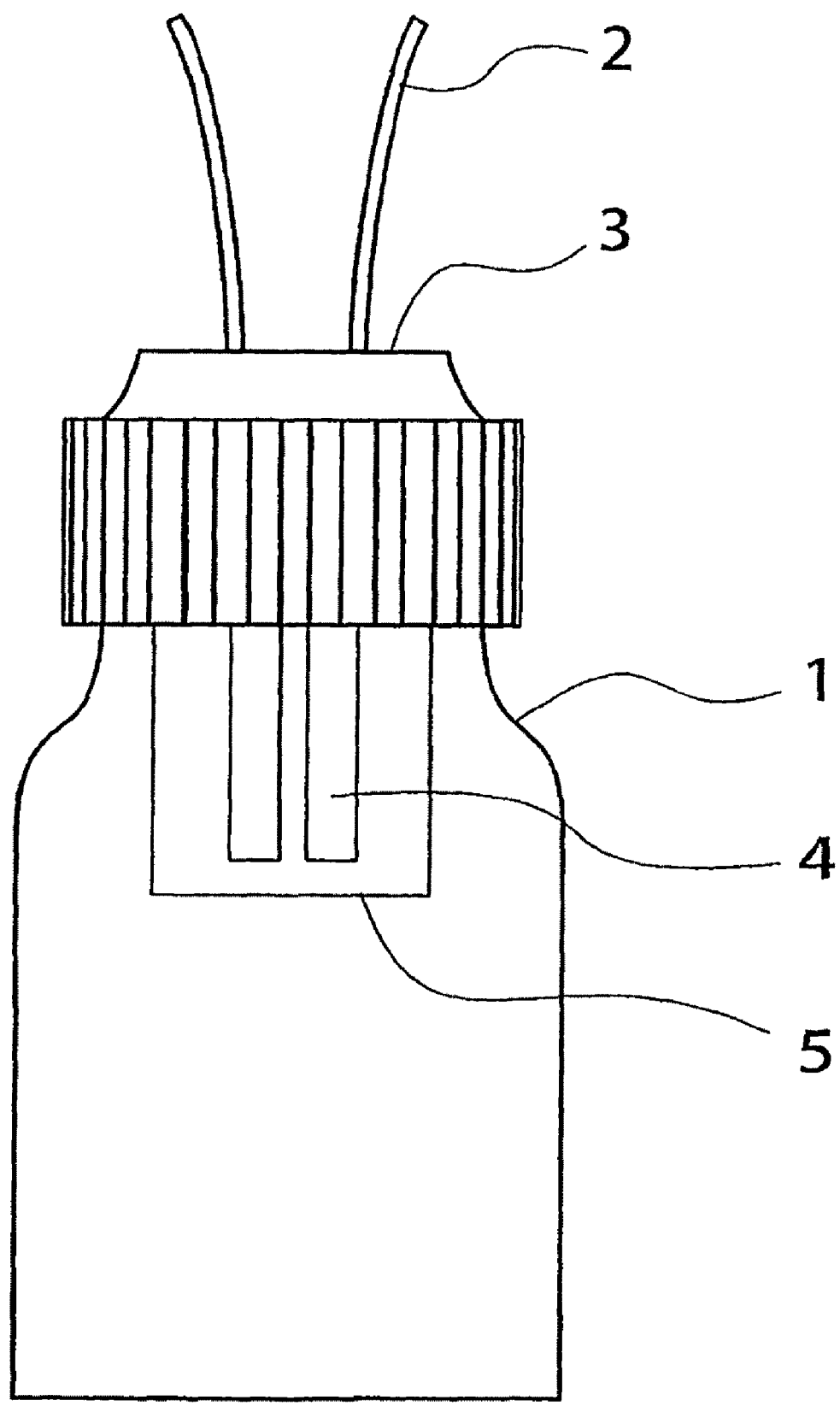
FIG. 1 is a schematic diagram of an electrochemical cell.

FIG. 1 is a schematic diagram of an electrochemical apparatus of the present invention.

In FIG. 1, the reference numeral 1 denotes an electrochemical cell, 2 denotes copper wires, 3 denotes a substrate plugging section, 4 denotes electrodes, and 5 denotes a substrate. The electrochemical apparatus of the present invention has two electrodes (4) and an electrochemical cell (1). It is preferable that the electrochemical apparatus of the present invention has also a voltage control device (not shown) for controlling voltage applied across the two electrodes and/or a current control device (not shown) for controlling current supplied between the two electrodes. The electrochemical apparatus of the present invention forms a molecular assembly by allowing the electrochemical cell to hold an electrolytic solution containing molecules to constitute the molecular assembly, and by applying a voltage (or supplying a current) between the two electrodes in the state wherein the electrolytic solution and the two electrodes are in contact.

Figure 2:
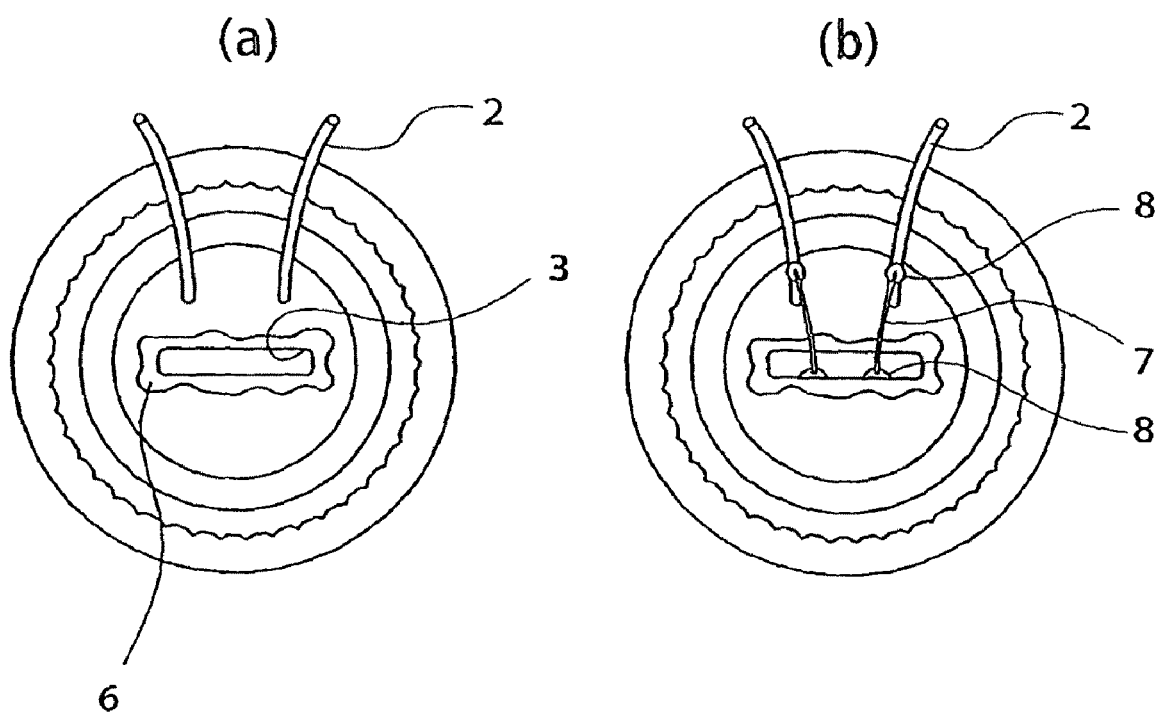
FIGS. 2 (a) and 2 (b) are schematic diagrams (top views) of an electrochemical cell.

A reference electrode and a potential measuring instrument for measuring the potential of the electrodes, a gate electrode and a computer for controlling may further be included. The electrochemical cell includes an electrolytic solution holding section for holding the electrolytic solution (solution), and a substrate plugging section for plugging the substrate. It is preferable that, for example, a clayey insulator is built up on the substrate plugging section as FIG. 2 (a) shows. This plays a role of holding the substrate, and simultaneously protecting the electrodes. Such an insulator is preferably putty. In FIG. 2 (a), the reference numeral 2 denotes copper wires, 3 denotes a substrate plugging section, and 6 denotes an insulator.

Substrate

The substrate of the present invention is preferably a substrate on which at least two electrodes can be mounted. The materials for the substrate include a glass substrate, a silicon substrate and a plastic substrate; however, the materials are not limited thereto if suited as a substrate for photolithography or electron beam lithography. The shape of the substrate is preferably rectangular parallelepiped. The length of the substrate is preferably 0.1 mm to 10 cm, more preferably 1 mm to 5 cm, further preferably 1 cm to 4 cm, and most preferably 2 cm to 3 cm. The substrate is preferably used after cleaned so as not to contain impurities.

Electrode

Figure 5:
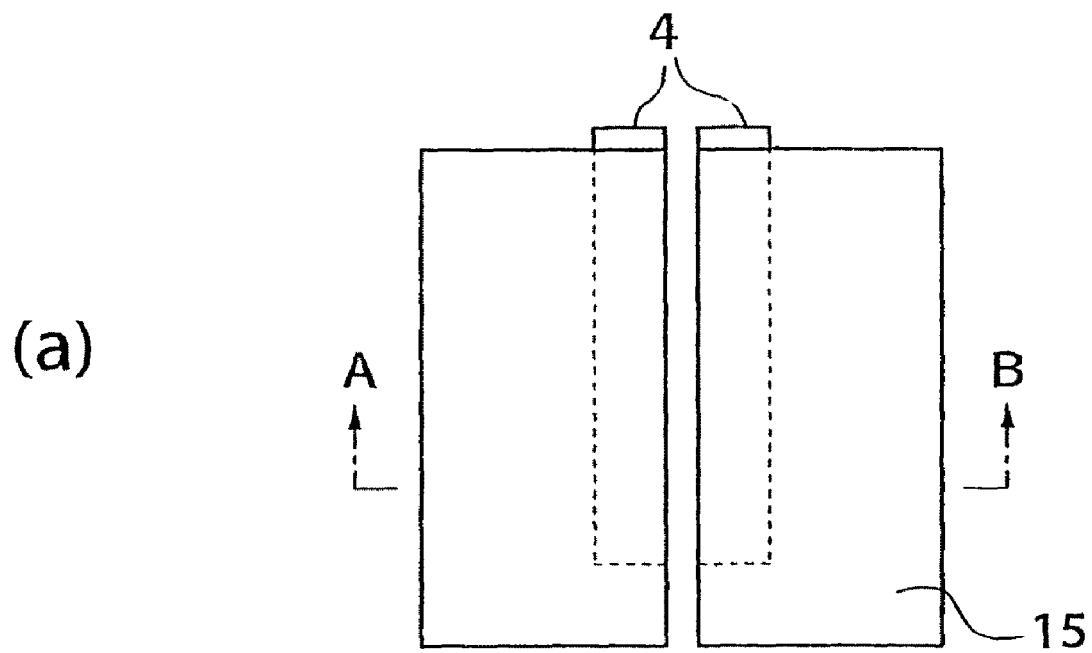
FIG. 5 is a diagram showing an example of electrodes on a substrate.
Figure 5:
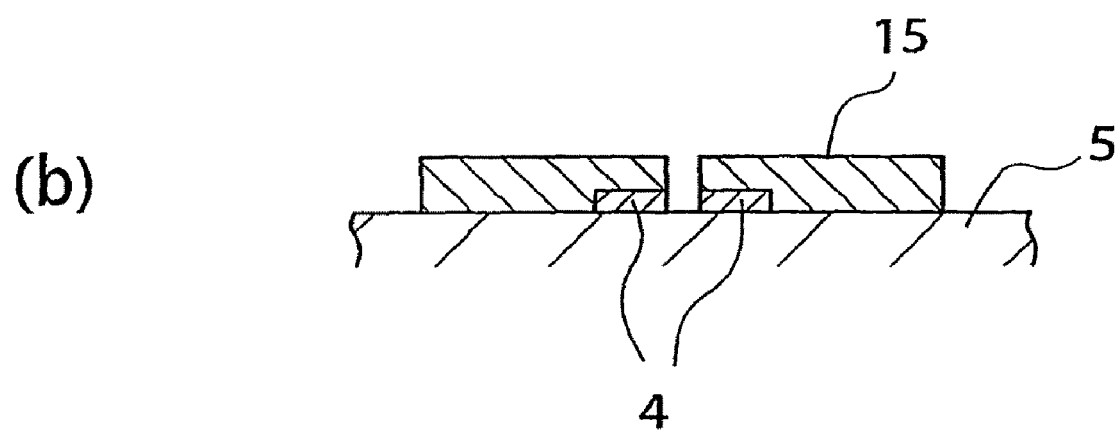

The electrodes in the present invention preferably include two electrodes facing each other and are mounted on a substrate. As FIGS. 6 (a) and 6 (b) show, a part of the two electrodes facing each other has preferably an insulated region covered with an insulator. The insulated regions include regions that use the surfaces of the electrodes other than surfaces closest to each electrode as the insulated region, as FIGS. 5 (a) and 5 (b) show; and when the electrodes have protrusions, regions that use the areas other than the protrusions as the insulated region, as FIGS. 7 (a) and 7 (b) show. In FIGS. 5 (a) and 5 (b), the reference numeral 4 denotes electrodes, 5 denotes a substrate and 15 denotes insulating layers. In FIGS. 7 (a) and 7 (b), the reference numeral 4 denotes electrodes, 5 denotes a substrate, 15 denotes an insulating layer and 16 denotes a gate electrode.

Figure 6:
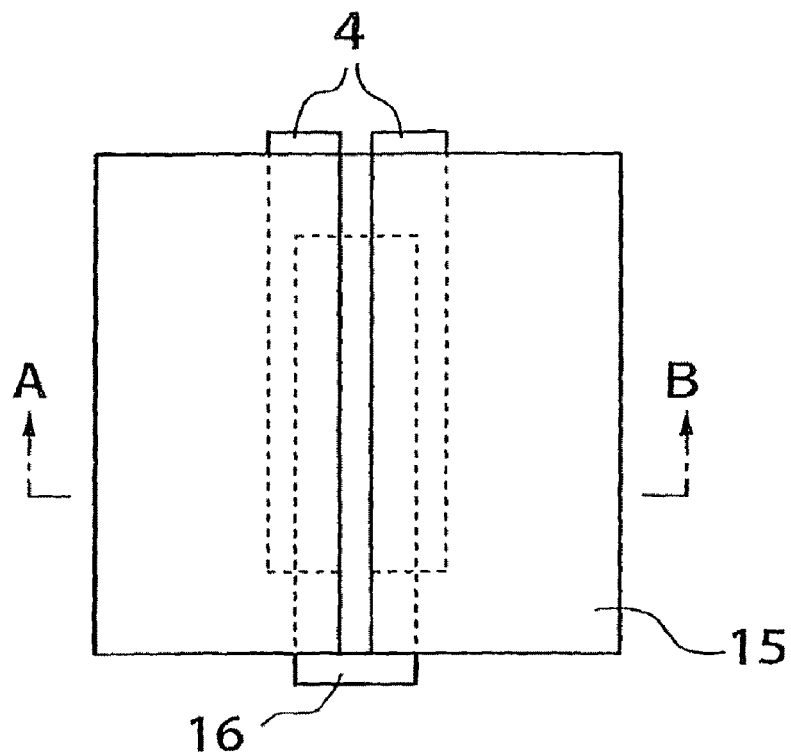
FIG. 6 is a diagram showing an example of electrodes on a substrate.
Figure 6:
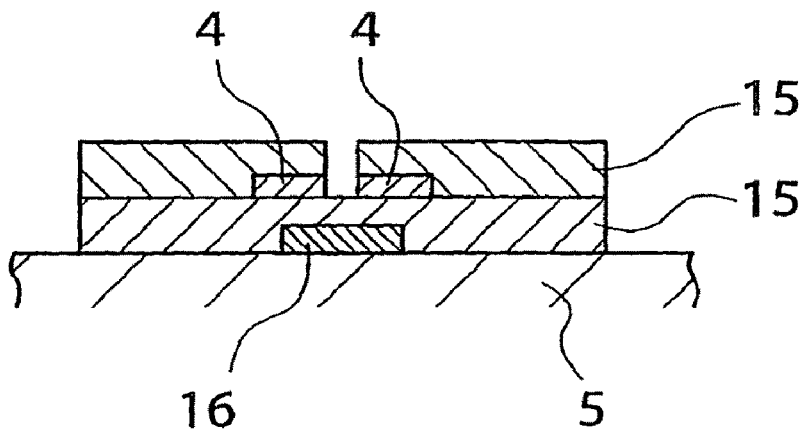
Figure 7:
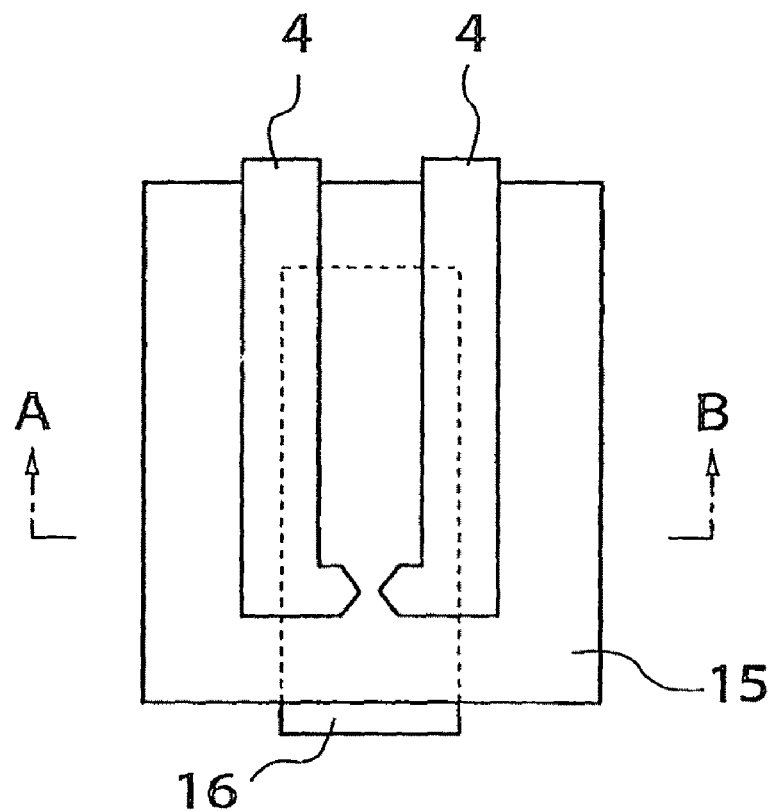
FIG. 7 is a diagram showing an example of electrodes on a substrate.
Figure 7:
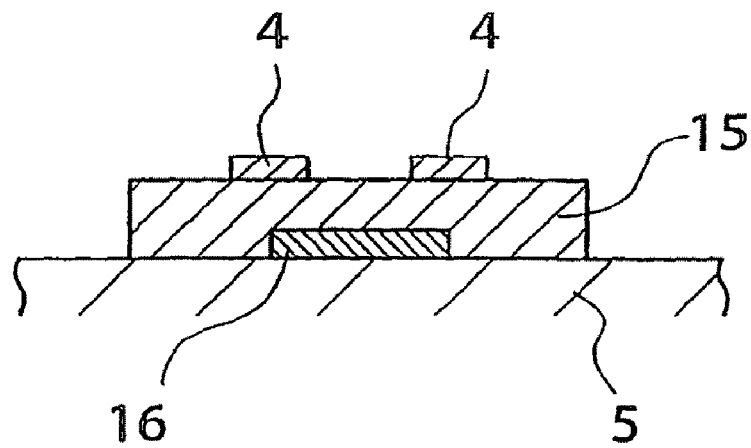

As FIGS. 6 (a) and 6 (b) show, the one including a gate electrode (16) formed on a substrate (5) and two electrodes (4) facing each other formed on insulating layers (15) that cover the gate electrode is preferable because it can function as an FET (field-effect transistor). In FIGS. 6 (a) and 6 (b), the reference numeral 4 denotes electrodes, 5 denotes a substrate, 15 denotes an insulating layer and 16 denotes a gate electrode.

The materials of the electrodes formed on the substrate include electrically conductive materials, such as gold, platinum, copper and graphite, among which gold and platinum are preferable; however, the materials are not limited thereto, as long as the material is suitable for the above-described lithography.

It is preferable that at least two electrodes are formed on the substrate; however, the electrochemical cell may play a role of one of the electrodes. A gate electrode or a reference electrode may also be formed; and an electrode for measuring the properties of the electrolytic solution or the like may also be formed.

Figure 3:
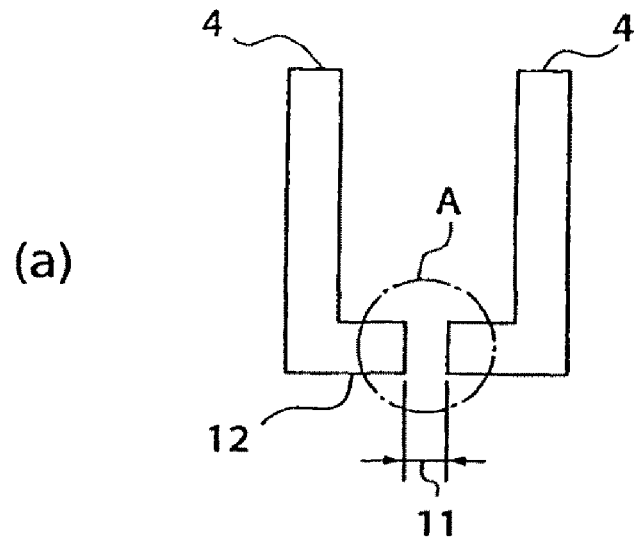
FIGS. 3 (a), (b) and (c) are schematic diagrams of respective electrodes.
Figure 3:
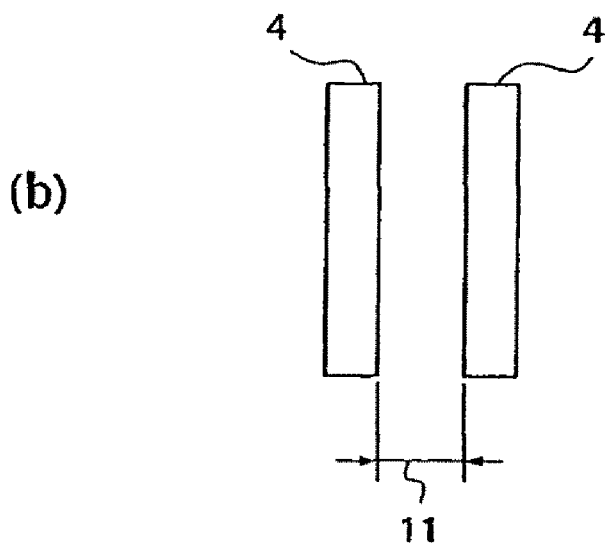
Figure 3:
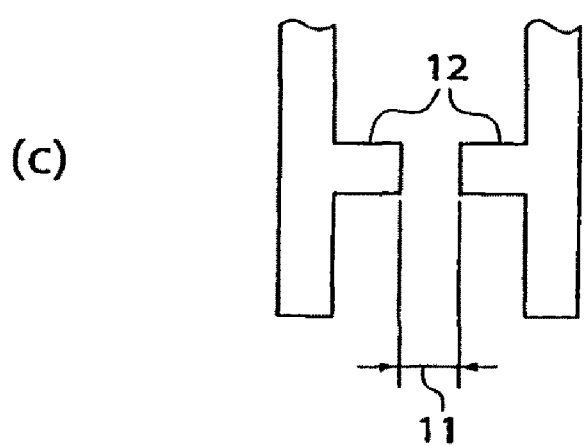

As the configuration of the electrodes, a configuration where two electrodes face each other as shown in FIG. 3 (b) is preferable; and having a protrusion located between both ends of each electrode and extending the other electrode, as shown in FIG. 3 (c), or having a protrusion located on one end of each electrode and extending toward the other electrode by bending the each electrode at the one end, as shown in FIG. 3 (a). This is because such shaped can effectively form a molecular assembly such as a conductive nano-wire. In FIGS. 3 (a), 3 (b) and 3 (c), the reference numeral 4 denotes electrodes, 11 denotes a gap and 12 denotes protrusions.

Figure 4:
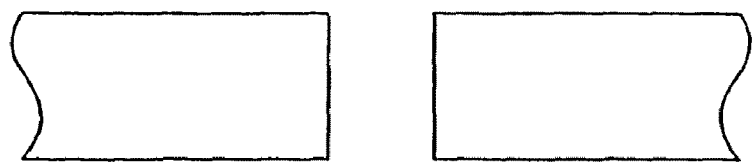
FIGS. 4 (a), (b) and (c) are schematic diagrams of respective protrusions (A in FIG. 3 (a), or the like)
Figure 4:
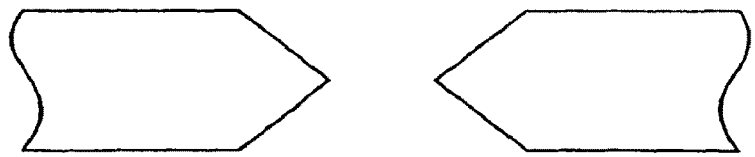
Figure 4:
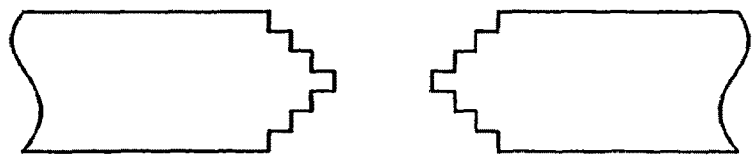

The shape of the protrusions is preferably such that the end of each of the gap portions of the two facing electrodes faces each other in parallel as exemplified in FIG. 4 (a); more preferably such that the end of the gap portion of the two facing electrodes is tapered with approaching the other gap portion as exemplified in FIGS. 4 (b) and 4 (c); among which the stepwise shape as shown in FIG. 4 (c) is preferable.

The gap (11) between the electrodes is preferably from 1 nm to 100 μm, more preferably 1 nm to 1 μm, and further preferably 1 nm to 200 nm; however, it is not limited thereto if it is suited for the length of a desired nano-wire.

The width of the electrodes is preferably 0.5 nm to 1 cm, and more preferably 0.5 nm to 200 nm, or 1 mm to 3 mm.

The length of the electrodes is preferably 1 nm to 25 mm.

It is preferable that the electrodes are immersed in an electrolytic solution. Preferably, 20% or more of the volume of the electrodes are immersed, more preferably 50% or more of the volume of the electrodes are immersed, and further preferably 80% or more of the volume of the electrodes are immersed.

It is also preferable that the electrolytic solution is dropped between the electrodes to perform electrolysis on the substrate.

Voltage Control Device

The voltage applied across the electrodes is preferably controlled by a voltage control device which is connected to the electrodes. It is more preferable that there is a reference electrode in the electrochemical cell and the potential difference between the electrodes can be measured, and based on the measure results, the voltage applied across the electrodes can be controlled. The current control device for controlling the current supplied between the electrodes may also be used together with or in place of the voltage control device.

Method of Fabricating Electrodes

It is preferable in the present invention that the electrodes are formed on a substrate. The methods of forming electrodes on a substrate include a mask vapor deposition method, a photolithography method, an electron beam lithography method, and a combination thereof; however, the methods are not limited thereto.

In the mask vapor deposition method, a mask wherein a pattern to be an electrode is cut out is laid over the substrate, and a metallic film is vapor-deposited from the above. Thereafter, the mask is removed from the substrate. Thus, the metallic film is deposited only on the area to be the electrode, and a minute electrode can be formed.

The electrode formation using the photolithography method includes a metallic film forming step for forming a metallic film on a substrate; a resist layer forming step for forming a resist layer on the metallic film vapor-deposited in the metallic film forming step; a light exposure step for exposing the resist layer formed in the resist layer forming step to a desired pattern; a developing step for developing the exposed resist layer; and an etching step for etching the metallic film using the resist layer left after developing as a mask. The resist for forming the resist layer is not specifically limited as long as it is a photoresist.

The electrode formation using the electron beam lithography method includes a metallic film forming step for forming a metallic film on a substrate; a resist layer forming step for forming a resist layer on the metallic film vapor-deposited in the metallic film forming step; an electron beam radiation step for radiating electron beams onto the resist layer formed in the resist layer forming step to a desired pattern; a developing step for developing the electron beam irradiated resist layer; and an etching step for etching the metallic film using the resist layer left after developing as a mask. The resist for forming the resist layer is not specifically limited as long as it is an electron beam resist.

Method for Forming Molecular Assembly

It is preferable that the method of forming a molecular assembly of the present invention is carried out using the above-described electrochemical apparatus. When the molecular assembly is formed, it is preferable to use a solution (electrolytic solution) wherein a substance for forming the molecular assembly (a molecular species to constitute the molecular assembly) is dissolved. It is preferable that the molecular assembly is formed using an electrolytic method wherein a voltage is applied to the electrolytic solution wherein a substance for forming the molecular assembly is dissolved by action of the above-described electrodes. In the present invention, a minute molecular assembly having a minute gap (such as a needle crystal and a nano-wire) can be formed. In a conventional molecular vapor deposition method carried out in ultra-high vacuum or molecular beam method, a functional group causing interaction such as hydrogen bond had to be introduced between molecules when a molecular assembly such as a nano-wire was formed. The obtained molecular assembly was a molecular assembly having a closed-shell structure, and since HOMO is occupied by two electrons, charge transfer was difficult to occur, and only a molecular assembly having no thermal and electrical conductivity (insulator) was formed. However, in the electrolytic crystal growing method (electrolytic method) of the present invention, electrons are extracted from a part of or entire HOMO of the closed-shell molecules, and the state wherein a part of or entire molecular assembly has become SOMO can be produced. In the present invention, by growing a needle crystal or a nano-wire in an electric field, the needle crystal or the nano-wire can be grown utilizing charge-transfer interaction. As a result, a thermally and electrically conductive needle crystal or nano-wire can be formed.

The substances to be a molecular assembly include an organic conductor, and a compound to form a conductor using an electrolytic method is more preferable.

Organic conductors include organic compounds that have π-electrons, among which TTF derivatives including BEDT-TFF derivatives, dmit complexes, porphyrin complexes and phthalocyanines are preferable.

The compounds that form electrical conductors using an electrolytic method include condensed polycyclic hydrocarbon derivatives, heterocyclic compound derivatives, heteropolycyclic compound derivatives, and complexes containing these derivatives, among which TTF derivatives including BEDT-TFF derivatives, dmit complexes, porphyrin complexes and phthalocyanines are preferable, phthalocyanines and porphyrins are more preferable, and TPP·[Co(Pc)(CN$_2$)] (tetraphenylphosphonium dicyanocobalt (III) phthalocyanine) represented by Formula I is especially preferable.

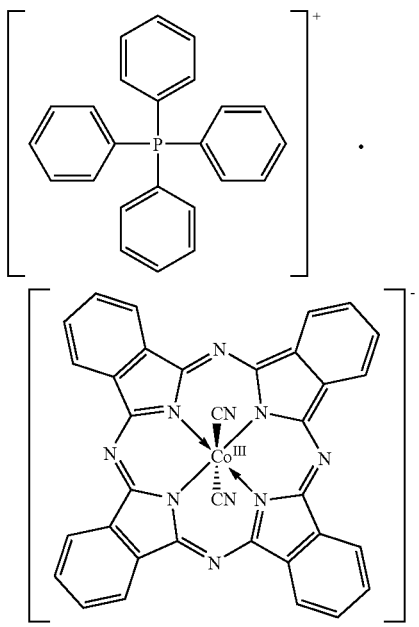

Formula I

Among phthalocyanines, a compound that has the basic skeleton represented by general formula II is preferable.

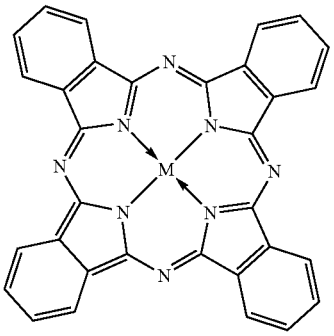

Formula II

Among porphyrins, a compound that has the basic skeleton represented by general formula III is preferable.

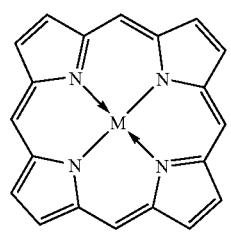

Formula III

The solvents for dissolving a substance to be a molecular assembly include organic solvents, among which acetonitrile, acetone, alcohols, benzene, halogenated benzene, 1-chloronaphthalene, dimethyl sulfoxide, N,N-dimethyl formamide, tetrahydrofuran, nitrobenzene, and pyridine are preferable; acetonitrile, acetone, ethanol, and methanol are more preferable; and acetone and acetonitrile are further preferable. As the proportion of the organic compound, the organic solvent wherein a substance to be a molecular assembly is saturated is exemplified; however, the proportion is not specifically limited.

The current supplied between the electrodes may be either a direct current or an alternate current. The current supplied between the electrodes is preferably 1 nA to 1 mA, and more preferably 100 nA to 10 μA. The potential difference between the electrodes is preferably 10 mV to 20 V, more preferably 1 V to 5 V, and most preferably 2 V to 3 V. In the case of an alternate current, a frequency of 1 mHz to 1 kHz is preferable, and a frequency of 500 mHz to 10 Hz is more preferable. In the case of an alternate current, although the waveforms include a sinusoidal wave, a square wave and a saw-tooth wave, a sinusoidal wave and a square wave are preferable, and a square wave is especially preferable. The amplitude in the case of an alternate current is preferably 10 mV to 20 V, more preferably 1 V to 5 V, and most preferably 2.5 V to 5 V. The time for applying the voltage is, for example, 10 days or less, preferably 0.001 seconds to 10 days, more preferably 1 second to 2 days; however, the time suitable for the size and type of the molecular assembly to be formed, and the applied voltage may be selected.

The temperature of the electrolytic solution is preferably −30° C. to 200° C., more preferably −30° C. to 120° C., and most preferably 15° C. to 30° C. It is preferable that the electrolytic solution is not boiled or freezed.

Molecular Assembly

The molecular assemblies obtained using the method of forming molecular assemblies of the present invention include needle crystals and conductive nano-wires. The term nano-wire used herein means a linear substance of a width of the width of a molecule to 1 μm and a length of the length of two molecules or longer, wherein molecules are regularly arrayed.

The diameter of a needle crystal and a nano-wire is preferably 1 nm to 1 μm, and more preferably 1 nm to 200 nm. The length of the needle crystal is 10 nm to 100 μm. The molecular assembly of the present invention has the ratio of the long axis l to the short axis s (l/s) of preferably 1 or more, and more preferably 2 or more.

As the method of forming molecular assemblies, the proportion of obtained molecular assemblies having a diameter of from 1 nm to 100 nm and a length of 10 nm to 100 μm is preferably 60% or more, further preferably 80% or more, more preferably 90% or more, yet preferably 95% or more, and most preferably 99% or more.

Particularly, the molecular assembly is constituted of repeated units each having preferably 1 to 100 regularly arranged rows of molecules constituting the molecular assembly, more preferably 1 to 50 rows, further preferably 1 to 20 rows, and most preferably 1, 2, 3, 4 or 5 rows. The needle crystal may be a wire-like crystal bending to some extent. Since the redox reaction by electrolysis is used, conductivity can be imparted to a nano-molecular assembly itself. Specifically, since the molecular assembly does not have a closed-cell structure as conventional nano-molecular assemblies, electron transfer easily occurs between molecules constituting the molecular assembly, the molecular assembly can be highly conductive.

The conductivity of the molecular assembly is preferably controlled depending on the requirement of the conductive nano-wire or the like. Generally, the conductivity is preferably 1 S·cm$^{-1}$ or higher and superconductivity or lower, more preferably 10 S·cm$^{-1}$ or higher and superconductivity or lower, further preferably 100 S·cm$^{-1}$ or higher and superconductivity or lower, and most preferably 500 S·cm$^{-1}$ or higher and superconductivity or lower; however, the conductivity may be 1×10$^{100}$ S·cm$^{-1}$ or lower, or may be 1×10$^{10}$ S·cm$^{-1}$ or lower, and the conductivity preferable for the use can be selected.

The shape of the molecular assembly is preferably linear, prismatic, columnar, and block-like; however, it is not specifically limited as long as the molecules are regularly arrayed.

The molecular assembly is preferably grown on a substrate, more preferably grown on or around electrodes, and most preferably between electrodes, especially in the gap portion. The electrochemical cell is preferably left stationary during the growing period.

The molecular assembly may be used as a conductive nano-wire as it is. Molecular assemblies may be bundled to form a conductive nano-wire, and molecular assemblies may be subjected to coupling treatment to, for example, conductive filler, and can be used as a conductive nano-wire.

Method of Fabricating Electronic Circuit

Figure 8:
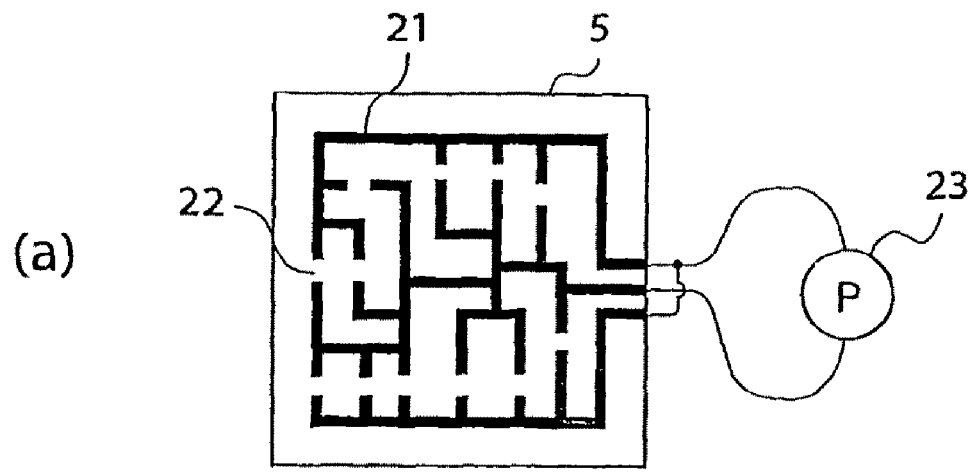
FIGS. 8 (a), (b) and (c) are diagrams showing an example of electronic circuits of the present invention.
Figure 8:
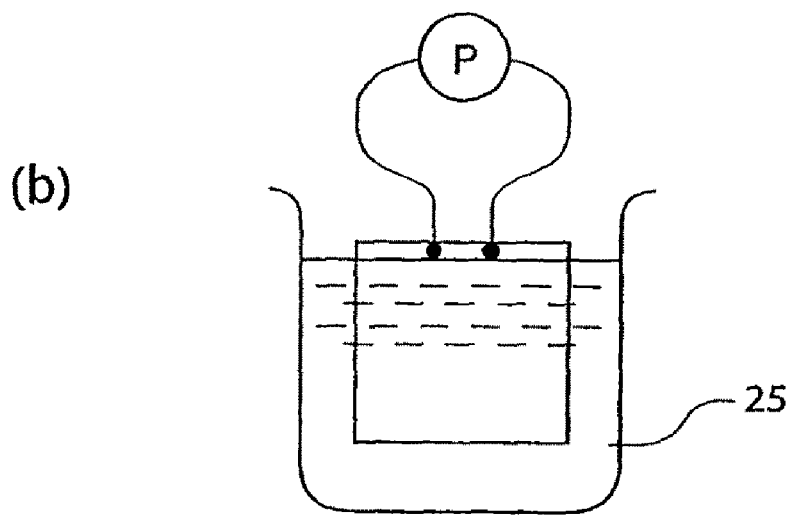
Figure 8:
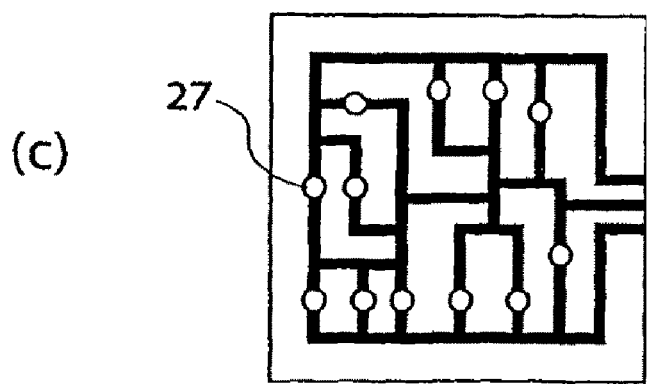

The present invention further provides a method of fabricating a functional electronic circuit, including a step for exposing the gap in an electronic circuit having a gap portion of from 1 nm to 100 μm with an electrolytic solution containing an organic conductor that has π-electrons; and a step for exposing the gap using a conductive molecular assembly formed in the gap when a voltage is applied to the electronic circuit. The present invention also provides a method of fabricating an electronic circuit having a connection portion formed of a conductive molecular assembly, including a step for exposing an electronic circuit having a gap portion of from 1 nm to 100 μm to be connected by a conductive molecular assembly with an electrolytic solution containing an organic conductor that has π-electrons; and a step for exposing the gap with conductive molecular assembly formed in the gap. For example, an electronic circuit having a gap as FIG. 8 (*a*) shows is previously fabricated, and after masking the circuit portion, the circuit is immersed in an electrolytic solution (FIG. 8 (*b*)), and a voltage is applied to the electronic circuit. Then, a conductive molecular assembly is formed in the gap portion, and connects the gap (FIG. 8 (*c*)). By controlling the formed molecular assembly, various characteristics can be imparted to the electronic circuit. When, the electronic circuit is contacted to the electrolytic solution, the portions other than the gap portion (especially the circuit portion of the electronic circuit) are preferably masked so as not to directly contact the electrolytic solution. In FIGS. 8 (*a*), 8 (*b*) and 8 (*c*), the reference numeral 21 denotes an electronic circuit, 22 denotes a gap, 23 denoted a DC/AC power source, 25 denotes an electrolytic solution, and 27 denotes a molecular assembly.

The conductive molecular assembly (conductive nano-wire) that connects the gap portion of the electronic circuit exhibits properties different from the properties of ordinary electronic circuits, such as a different conductivity. Utilizing the characteristics of the conductive molecular assembly portion, a functional electronic circuit is fabricated. The electronic circuit fabricated using the above-described method can be used as it is as a chip, such as an IC.

The conductive molecular assembly portion functions as an element such as a transistor and a tunnel element. The circuit portion has a different resistivity from the conductive molecular assembly portion. Therefore, if the conductive molecular assembly is controlled, an electronic circuit having an adequate resistance can be fabricated.

As the gap portion of an electronic circuit, the present invention can preferably use a gap of an atom to about 10 atoms. For example, one or two atoms can be used for connecting the circuit to fabricate a connected device. Thereby, a functional element at a molecular level, such as an monatomic tunnel element and an monatomic transistor, can be fabricated.

EXAMPLES

Example 1

Fabrication of Electrochemical Cell

An electrochemical cell shown in FIG. 1 was fabricated using a commercially available reagent bottle. As FIG. 2 (*b*) shows, copper wires were connected to an upper portion of the electrodes with gold wires. In FIG. 2 (*b*) the reference numeral 2 denotes copper wires, 7 denotes gold wires, and 8 denotes silver paste.

As the electrolytic solution-holding section, the body portion of the reagent bottle was used; and as the substrate-plugging section, the altered cap of the reagent bottle was used. Putty was mounded up on the substrate-plugging section.

The diameter of the reagent bottle was 23 mm.

Example 2

Fabrication of Electrodes with 20-μm Gap

The electrodes used in the electrolytic molecular assembly growing method were formed on a glass plate. A glass plate of a size of 25×10 mm was prepared, and a mask was deposited on the glass plate. Thereafter, gold was vapor-deposited on the masked glass substrate. Then, the mask was removed from the glass substrate. Thus, gold electrodes were formed on the glass substrate. The width of each electrode was 2 to 5 mm, the length of each electrode was 2.0 cm to 2.3 cm, and the gap between the electrodes was 20 μm.

Example 3

Fabrication of Nano-Gap Electrodes

The electrodes used in the electrolytic molecular assembly growing method were formed on a glass plate. A glass plate of a size of 25×10 mm was prepared, and platinum was vapor-deposited on the glass substrate. A mask having a rough shape of the electrodes was printed on an OHP sheet. A photoresist agent was spin-coated on the platinum-deposited glass substrate. Spin coating was performed for 60 seconds at a rotation speed of the spin coater of 3,000 rpm. The photoresist agent was dried at 110° C. for 1 minute to form a coating film. The glass substrate coated with the photoresist agent was exposed using a mask aligner with a mercury-lamp light source through the mask. Developing was performed using a Microposit Developer MF319 (manufactured by Shipley Far East, Ltd.) for 60 seconds. At that time, the portion not exposed was completely dissolved. The glass substrate was then cleaned with pure water. Thus, the rough shapes of the electrodes were formed.

Further, the substrate on which the rough pattern of the electrodes had been formed was coated with an electron beam resist ZEP7000 (manufactured by ZEON corporation) of a thickness of 350 nm using a spin coater. Thereafter, the substrate was baked in the atmosphere at 180° C. for 180 minutes. The substrate exhibited fair wetness and spreading to the electron beam resist. Electron beam drawing was performed on the electron beam resist-coated substrate. Specifically, the substrate was scanned along the graphic data consisting of a large number of dense thin lines using Gaussian circular electron beams having a diameter of 20 nm, an accelerating voltage of 30 kV and an electron beam intensity of $4\ \mu C \cdot cm^{-2}$ to perform electron beam light exposure. After light exposure, the developing process of the electron beam resist was performed using ZED500 (manufactured by ZEON corporation). Thus, the electrodes were formed.

Example 1-1

To the electrolytic solution holding section, 5 mg of TPP·$[Co(Pc)(CN)_2]$ and 14 ml of acetonitrile were added and dissolved to form a saturated electrolytic solution containing insoluble substances. The electrode substrate was plugged in the substrate plugging section, and the electrode substrate was fixed in place using putty. Gold wires were placed between the upper portions of the electrodes and the copper wires of the electrochemical cell, and fixed with silver paste. After connecting the substrate holding section to the electrolytic solution holding section, a digital multi-meter was connected to the copper wires. A voltage of 2.0 V was applied to the electrodes, and allowed to stand for one day. The temperature of the electrolytic solution was 23° C.

Figure 9:
FIG. 9 is an SEM photo of a molecular assembly formed in Example 1-1 substituting the diagram.

The molecular assembly thus obtained was columnar with a length of 50 μm to 300 μm and a width of 5 μm to 30 μm. The SEM photograph of thus obtained molecular assembly is shown in FIG. 9.

Example 1-2

A molecular assembly was formed in the same manner as in Example 1-1 except that the electrolyzing time was 100 minutes.

Figure 10:
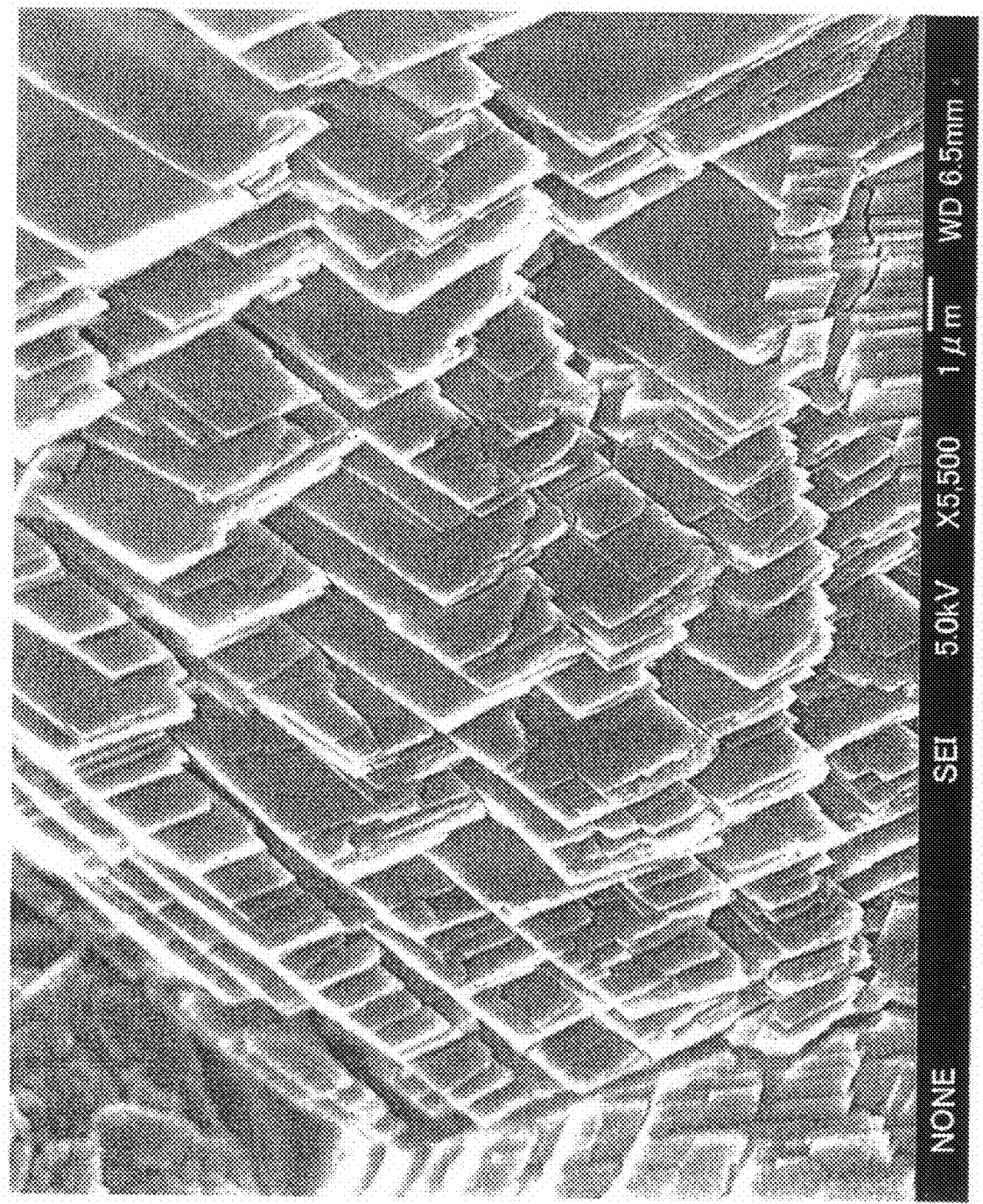
FIG. 10 is an SEM photo of a molecular assembly formed in Example 1-2 substituting the diagram.

The molecular assembly thus obtained was plate-like with a length of 10 μm to 20 μm and a width of 1 μm to 5 μm. The SEM photograph of thus obtained molecular assembly is shown in FIG. 10.

Example 1-3

A molecular assembly was formed in the same manner as in Example 1-1 except that a voltage of 1.0 V was applied for one day, and a voltage of 1.5 V was further applied for one day.

Figure 11:
FIG. 11 is an SEM photo of a molecular assembly formed in Example 1-3 substituting the diagram.

The molecular assembly thus obtained was block-like with a length of 6 μm to 10 μm and a width of 2 μm to 5 μm. The SEM photograph of thus obtained molecular assembly is shown in FIG. 11.

Example 1-4

A molecular assembly was formed in the same manner as in Example 1-1 except that the electrolyzing time was 193 minutes.

Figure 12:
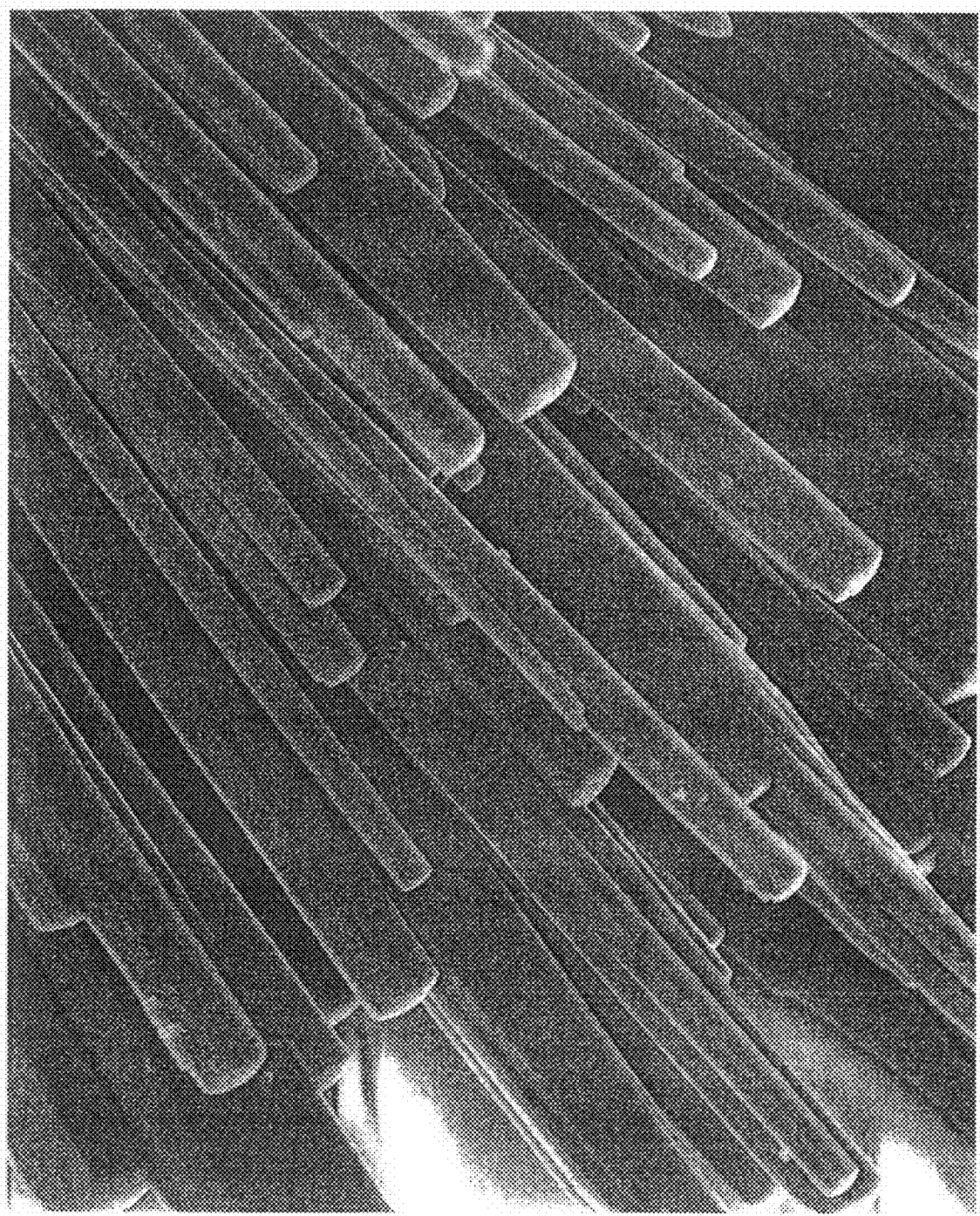
FIG. 12 is an SEM photo of a molecular assembly formed in Example 1-4 substituting the diagram.

The molecular assembly thus obtained was columnar with a length of 10 μm to 50 μm and a width of 500 nm to 8 μm. The SEM photograph of thus obtained molecular assembly is shown in FIG. 12.

Example 1-5

A molecular assembly was formed in the same manner as in Example 1-1 except that the applied voltage was 2.5 V and the electrolyzing time was 193 minutes.

Figure 13:
FIG. 13 is an SEM photo of a molecular assembly formed in Example 1-5 substituting the diagram.

The molecular assembly thus obtained was columnar with a length of 10 μm to 50 μm and a width of 500 nm to 8 μm. The SEM photograph of thus obtained molecular assembly is shown in FIG. 13.

Example 1-6

A molecular assembly was formed in the same manner as in Example 1-1 except that the applied voltage was 2.5 V and the electrolyzing time was 33 minutes.

Figure 14:
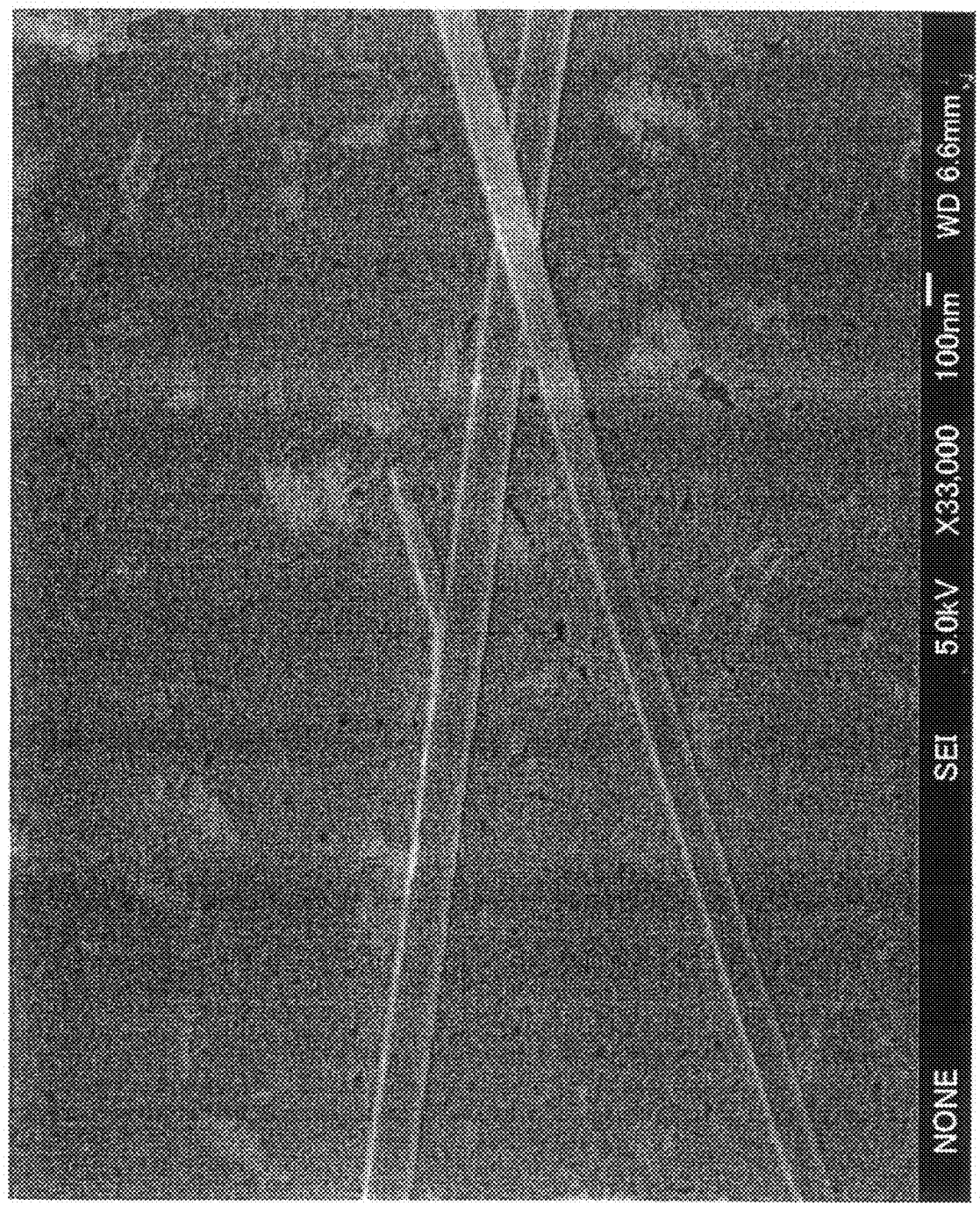
FIG. 14 is an SEM photo of a molecular assembly formed in Example 1-6 substituting the diagram.

The molecular assembly thus obtained was needle-like with a length of 10 μm to 50 μm and a width of 100 nm to 200 nm. The SEM photograph of thus obtained molecular assembly is shown in FIG. 14.

Example 1-7

A molecular assembly was formed in the same manner as in Example 1-1 except that the applied voltage was 2.5 V and the electrolyzing time was 26 minutes.

Figure 15:
FIG. 15 is an SEM photo of a molecular assembly formed in Example 1-7 substituting the diagram.

The molecular assembly thus obtained was bent wire-like with a length of 2 μm to 10 μm and a width of 200 nm to 300 nm. The SEM photograph of thus obtained molecular assembly is shown in FIG. 15.

Example 1-8

A molecular assembly was formed in the same manner as in Example 1-1 except that the applied voltage was 2.5 V and the electrolyzing time was 26 minutes.

Figure 16A:
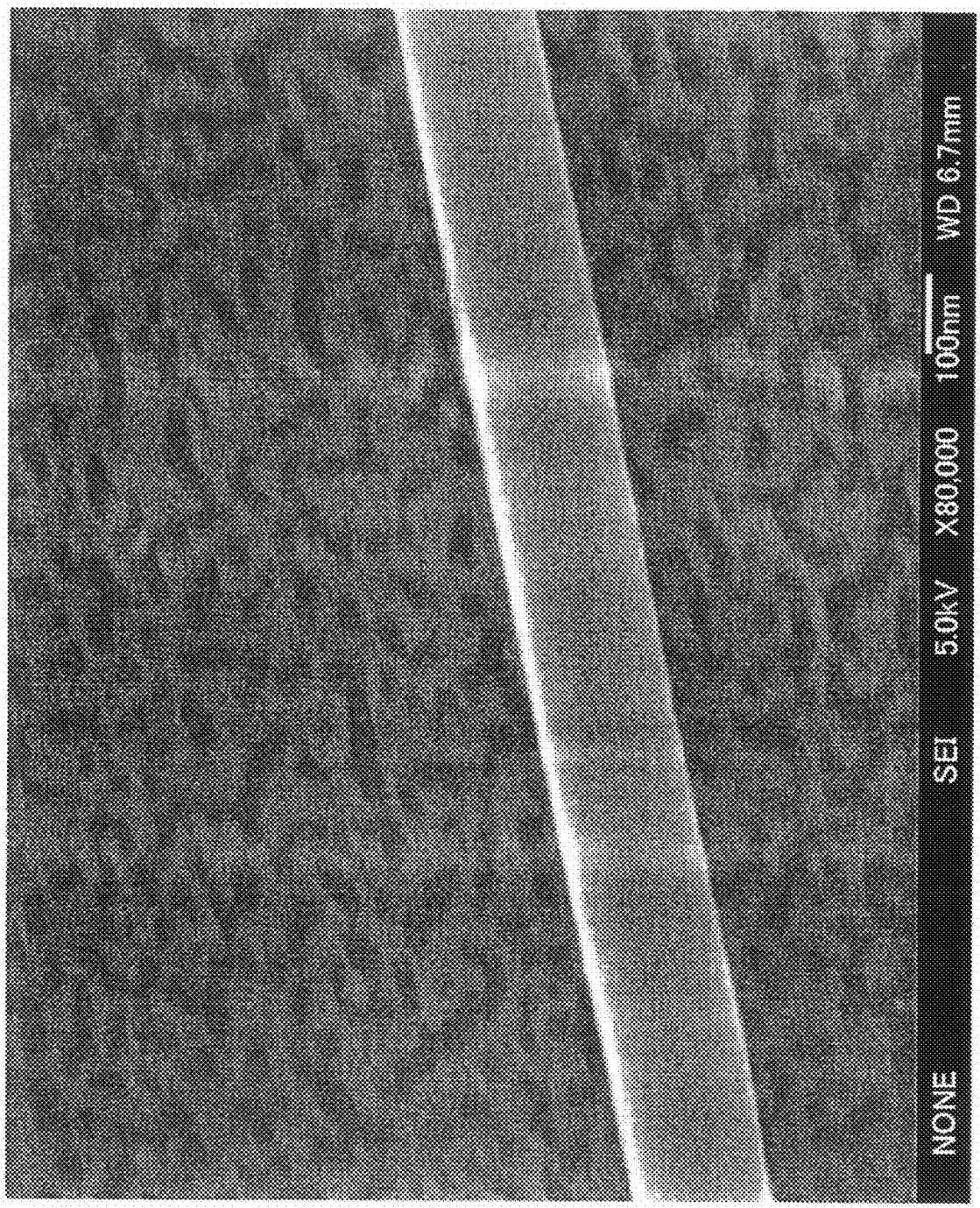
FIG. 16 is an SEM photo of a molecular assembly formed in Example 1-8 substituting the diagram.
Figure 16B:

The molecular assembly thus obtained was needle-like with a length of 10 μm to 30 μm and a width of 100 nm to 300 nm. The SEM photograph of thus obtained molecular assembly is shown in FIG. 16.

Example 1-9

A molecular assembly was formed in the same manner as in Example 1-1 except that the applied voltage was 2.5 V and the electrolyzing time was 4 minutes.

Figure 17:
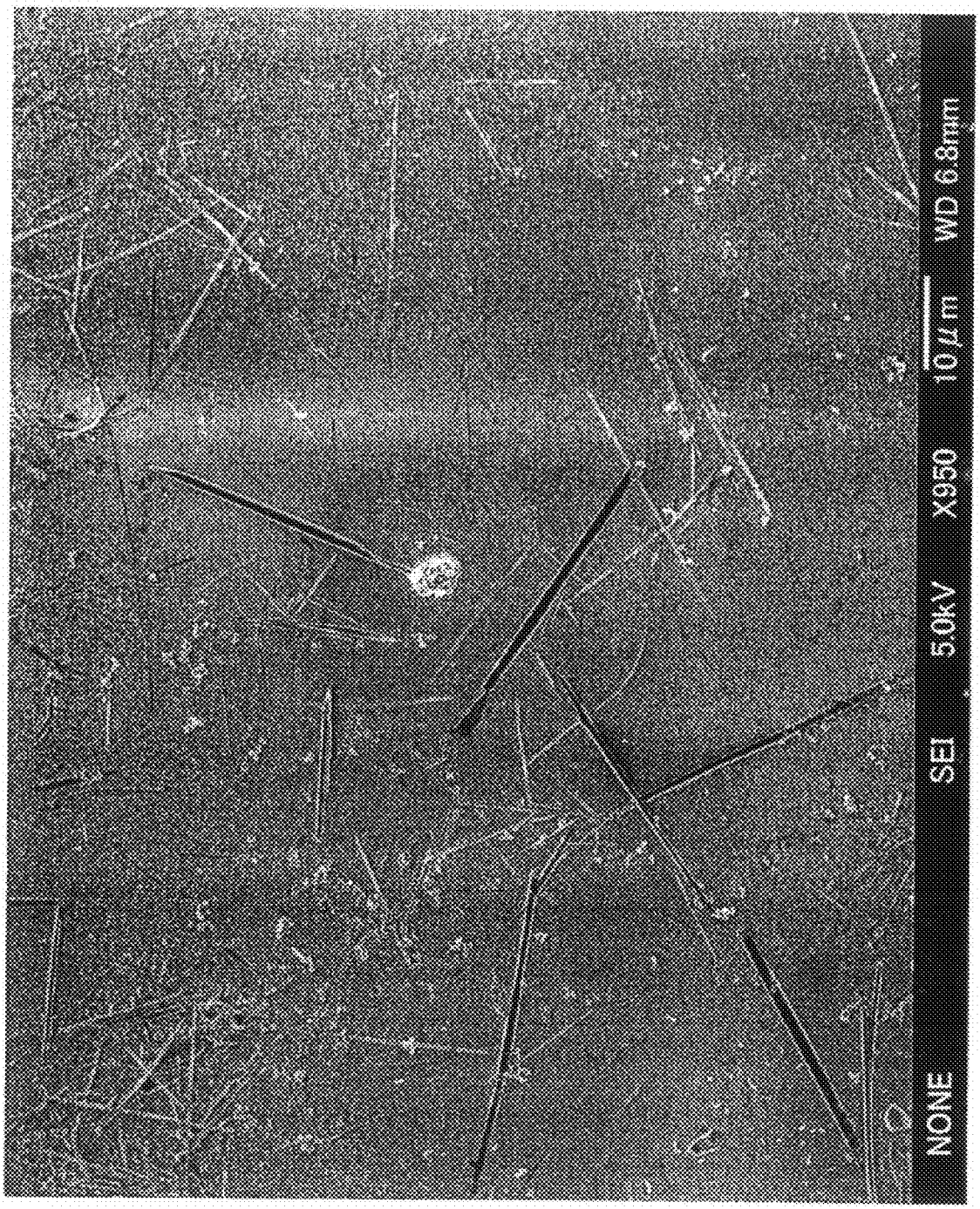
FIG. 17 is an SEM photo of a molecular assembly formed in Example 1-9 substituting the diagram.

The molecular assembly thus obtained was needle-like with a length of 5 μm to 30 μm and a width of 300 nm to 3 μm. The SEM photograph of thus obtained molecular assembly is shown in FIG. 17.

Example 2-1

A molecular assembly was formed in the same manner as in Example 1-1 except that nano-gap electrodes formed by electron beam lithography were used as the substrate (FIGS. 3*a* and 4*c*), the applied voltage was 2.5 V and the electrolyzing time was 339 minutes.

Figure 18:
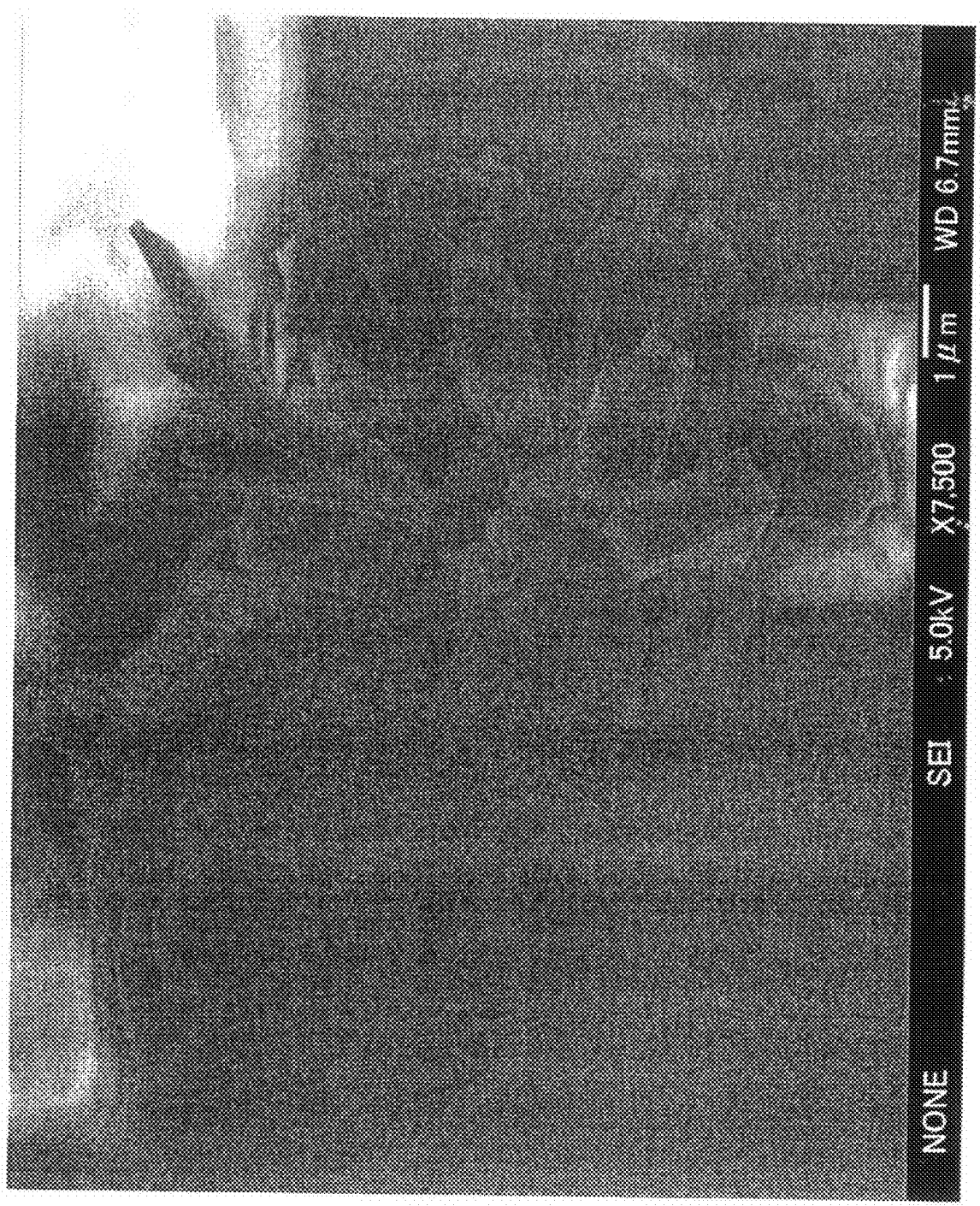
FIG. 18 is an SEM photo of a molecular assembly formed in Example 2-1 substituting the diagram.

The molecular assembly thus obtained was block-like with a length of 1 μm to 10 μm and a width of 500 nm to 3 μm. The SEM photograph of thus obtained molecular assembly is shown in FIG. 18.

Example 3-1

A molecular assembly was formed in the same manner as in Example 1-1 except that an alternate current (amplitude: 3.0 V, frequency: 2.0 Hz, square waves) was used, and the electrolyzing time was 10 seconds.

Figure 19:
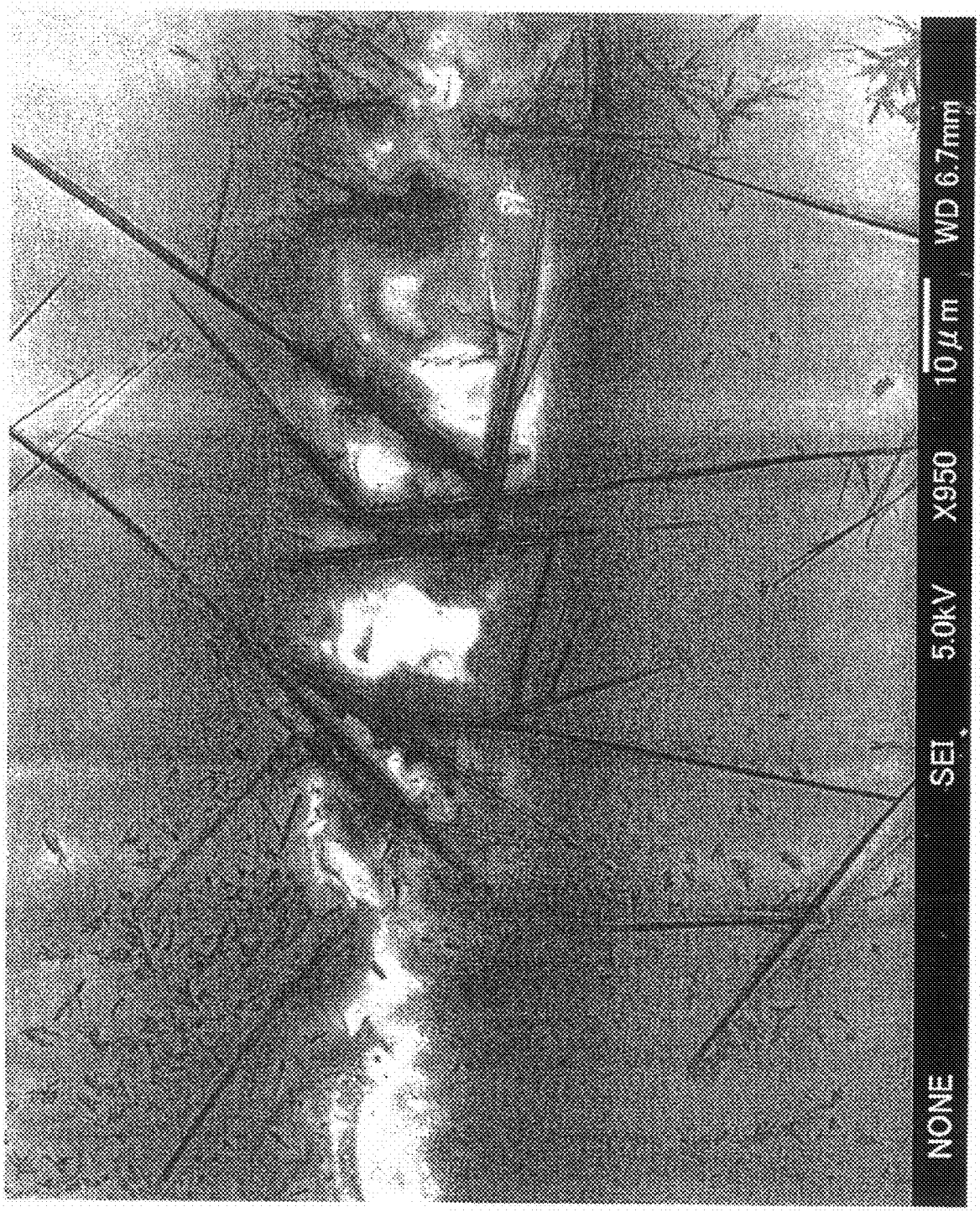
FIG. 19 is an SEM photo of a molecular assembly formed in Example 3-1 substituting the diagram.

The molecular assembly thus obtained was needle-like with a length of 30 μm to 50 μm and a width of 500 nm to 1 μm. The SEM photograph of thus obtained molecular assembly is shown in FIG. 19.

Example 3-2

A molecular assembly was formed in the same manner as in Example 3-1 except that an alternate current (amplitude: 2.5 V, frequency: 0.1 Hz, sinusoidal waves) was used, and the electrolyzing time was 4 minutes; and then an alternate current (amplitude: 5.0 V, frequency: 0.1 Hz, sinusoidal waves) was used, and the electrolyzing time was 18 minutes.

Figure 20:
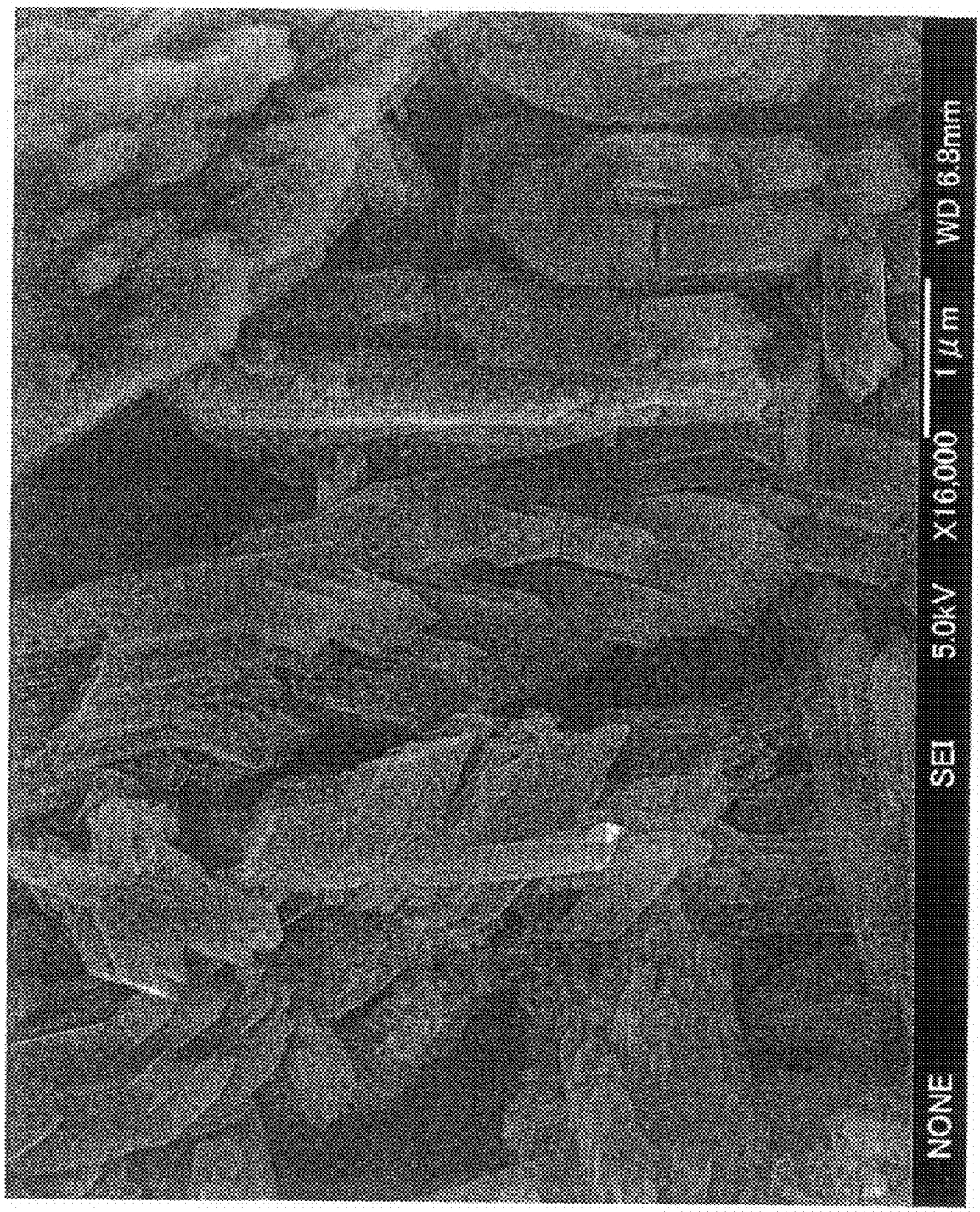
FIG. 20 is an SEM photo of a molecular assembly formed in Example 3-2 substituting the diagram.

The molecular assembly thus obtained was block-like with a length of 1 μm to 3 μm and a width of 200 nm to 800 nm. The SEM photograph of thus obtained molecular assembly is shown in FIG. 20.

Example 3-3

A molecular assembly was formed in the same manner as in Example 3-1 except that an alternate current (amplitude: 5.0 V, frequency: 0.5 Hz, square waves) was used, and the electrolyzing time was 20 minutes.

Figure 21:
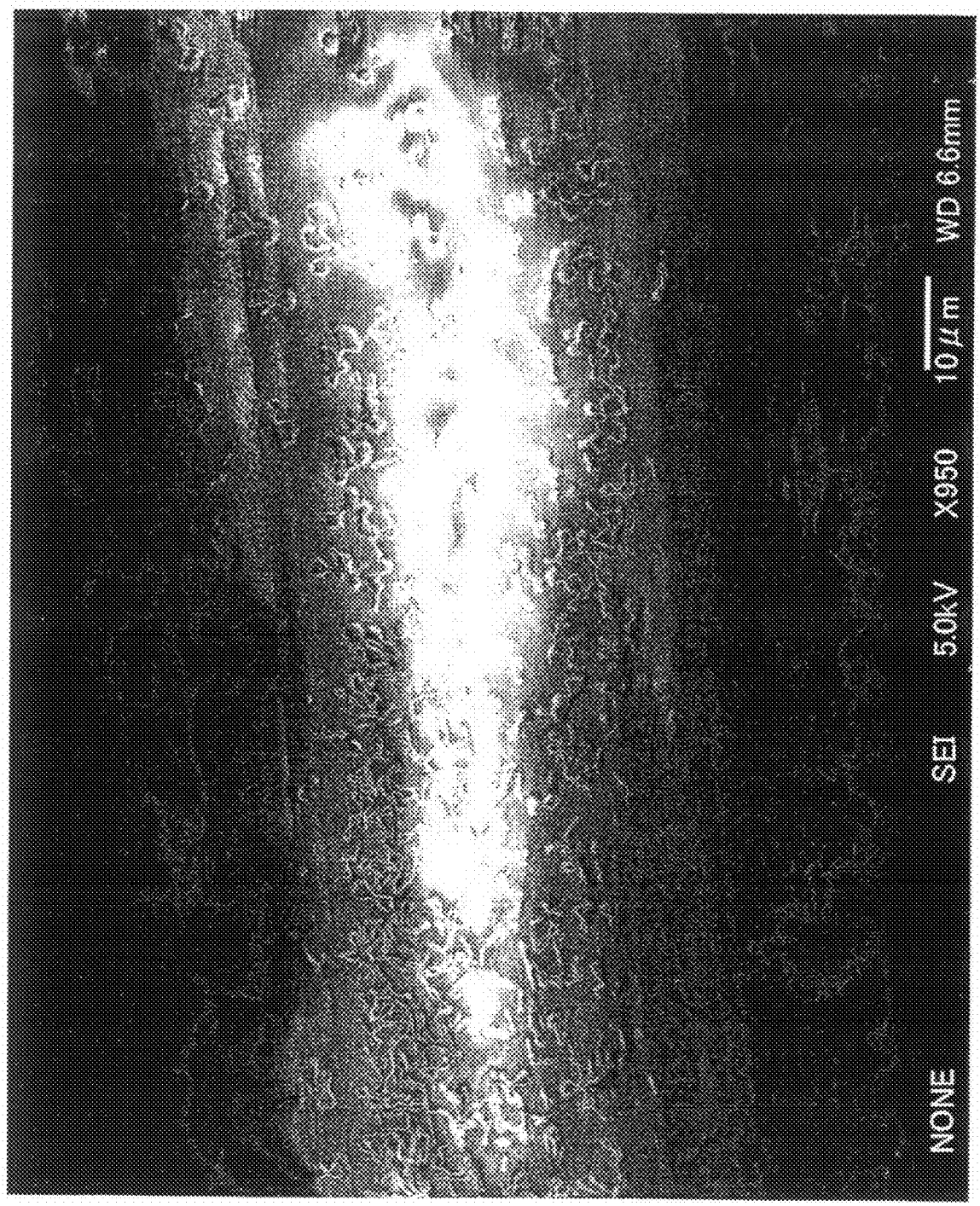
FIG. 21 is an SEM photo of a molecular assembly formed in Example 3-3 substituting the diagram.

The molecular assembly thus obtained was needle-like bundle with a length of 500 nm to 10 μm and a width of 50 nm to 1 μm. The SEM photograph of thus obtained molecular assembly is shown in FIG. 21.

Example 3-4

A molecular assembly was formed in the same manner as in Example 3-1 except that an alternate current (amplitude: 5.0 V, frequency: 0.2 Hz, square waves) was used, and the electrolyzing time was 23 minutes.

Figure 22:
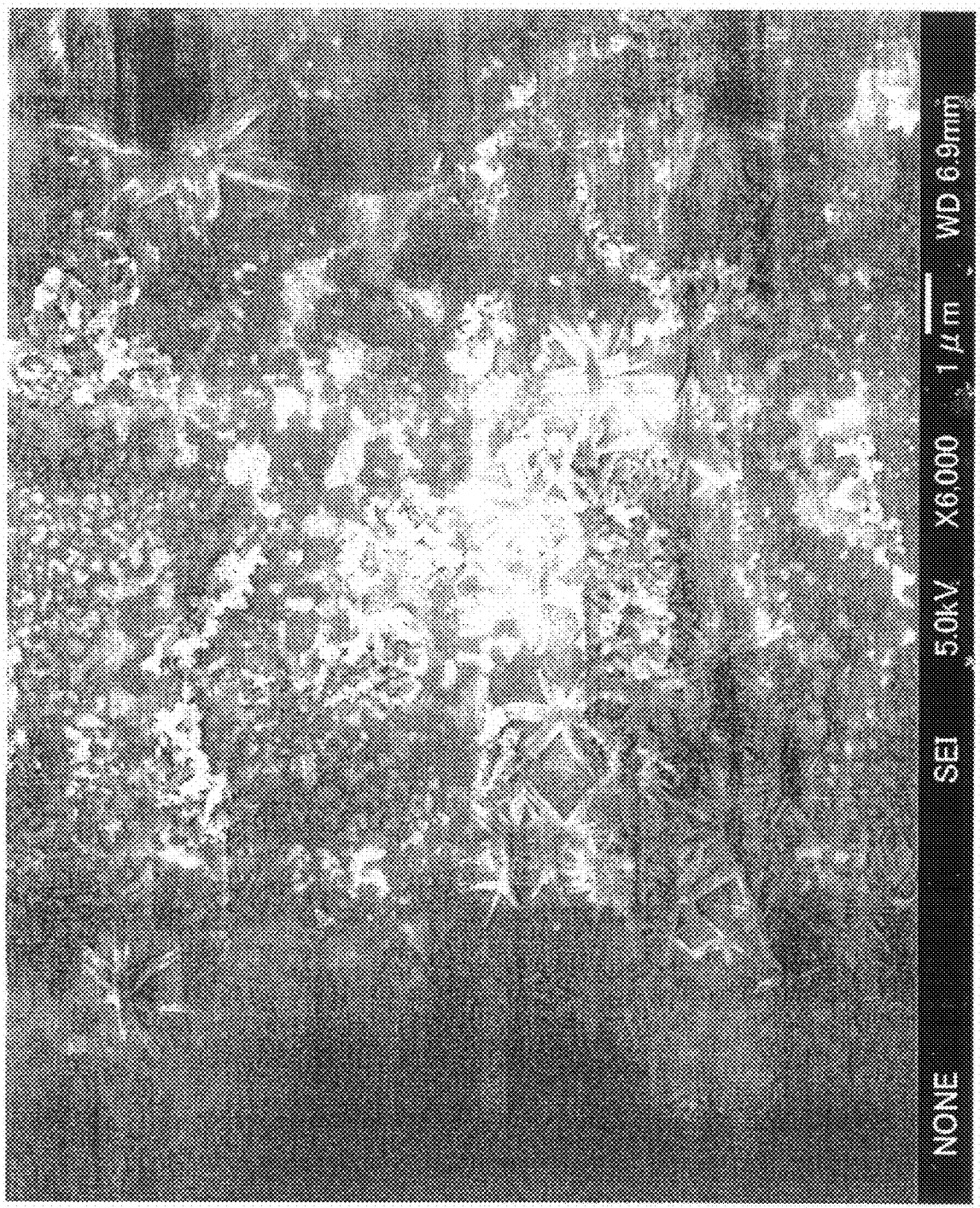
FIG. 22 is an SEM photo of a molecular assembly formed in Example 3-4 substituting the diagram.

The molecular assembly thus obtained was needle-like bundle with a length of 1 μm to 3 μm and a width of 100 nm to 500 nm. The SEM photograph of thus obtained molecular assembly is shown in FIG. 22.

Example 3-5

A molecular assembly was formed in the same manner as in Example 3-1 except that an alternate current (amplitude: 5.0 V, frequency: 0.1 Hz, square waves) was used, and the electrolyzing time was 5 minutes.

Figure 23:
FIG. 23 is an SEM photo of a molecular assembly formed in Example 3-5 substituting the diagram.

The molecular assembly thus obtained was needle-like with a length of 10 μm to 20 μm and a width of 1 μm to 2 μm. The SEM photograph of thus obtained molecular assembly is shown in FIG. 23.

Example 4-1

The electrode substrate was plugged in the substrate plugging section, and the electrode substrate was fixed in place using putty. Gold wires were placed between the upper portions of the electrodes and the copper wires of the electrochemical cell, and fixed with silver paste (FIG. 2 (b)). One drop of an acetonitrile saturated solution of TPP·[Co(Pc)(CN)$_2$] was placed on the substrate using a Pasteur pipette so as to cover both electrodes. After connecting the substrate holding section to the electrolytic solution holding section, a digital multi-meter was connected to the copper wires. An alternate current (amplitude: 3.0 V, frequency: 2.0 Hz, square waves) was supplied to the electrodes, and allowed to stand for 10 seconds. The temperature of the electrolytic solution was 23° C.

Figure 24:
FIG. 24 is an SEM photo of a molecular assembly formed in Example 4-1 substituting the diagram.

The molecular assembly thus obtained was needle-like with a length of 10 μm to 50 μm and a width of 200 nm to 1 μm. The SEM photograph of thus obtained molecular assembly is shown in FIG. 24.

INDUSTRIAL APPLICABILITY

According to the present invention, a molecular assembly of a minute conductive compound can be controlled and fabricated at a molecular level (nano-level).

According to the method of fabricating an electrochemical apparatus and a molecular assembly, a minute needle crystal and nano-wire controlled at a nano-level order can be formed. Since the electrochemical apparatus can be fabricated without using vacuum, the costs can be drastically reduced. According to the present invention, since molecules coagulate spontaneously by means of charge-transfer interaction to make a self-assembly, a molecular assembly and a nano-wire can be formed without introducing an interactive functional group into the molecule.

Also according to the present invention, since the molecular assembly is grown in a system other than vacuum, such as in a solution, the situation wherein the properties of the molecular assembly change when vacuum is broken can be avoided.

Since the structure of the molecular assembly of the present invention is controlled at a molecular level, applications to various devices are expected.

If the molecular assembly of the present invention is a molecular assembly of an organic conductor, it can be applied to an antistatic agent, an electron gun, or a circuit element.

For example, if molecules having SOMO are present, the molecular assembly of the present invention becomes a partially oxidized state, and has a high conductivity unlike conventional minute molecular assemblies (nano-wires etc.). Therefore, the molecular assembly of the present invention can be used as the molecular wiring for LSIs or the like. An FET element can also be fabricated using the molecular assembly of the present invention itself. By replacing other functional molecules with a part of the component of the minute molecular assembly of the present invention, the conductivity can be controlled, or a magnetic function, photoconductivity and a memory function can be imparted.

In addition, by using only one or two molecules for the connection of electronic circuits to fabricate a connected device, a functional element at a molecular level, such as a monatomic tunnel element and a monatomic transistor can be fabricated.

Furthermore, according to the present invention, an electronic circuit having a desired function can be easily and conveniently fabricated at a molecular level, and the function can also be easily controlled.

The invention claimed is:

1. A method of electrically fabricating an electrically conductive nano-wire using an electrochemical apparatus, said electrochemical apparatus comprising:
   two electrodes facing each other, and formed on a substrate,
   an electrochemical cell, and a voltage control device connected to the two electrodes, for controlling a voltage applied to the two electrodes; wherein the electrochemical cell includes:

an electrolytic solution holder section for holding an electrolytic solution, and a substrate plug section for plugging the substrate;

the site of the substrate plug section exposing the substrate when the substrate is plugged in the substrate plug section is covered with an insulator;

the two electrodes have respective protrusions located either between both ends of each electrode and extending toward the other electrode, or on one end of each electrode and extending toward the other electrode by bending the each electrode at the one end;

each end of the protrusions of the two facing electrodes faces each other in parallel, or is tapered as approaching the other protrusion;

the two electrodes have an insulated portion covered with an insulator; and a gap between the closest sites of the two electrodes formed on the substrate is from 1 nm to 100 μm;

wherein the electrochemical cell holds said electrolytic solution, said electrolytic solution containing tetraphenyl phosphonium dicyanocobalt (III) phthalocyanine, which are molecules that are to constitute a molecular assembly by growing a crystal utilizing charge-transfer interaction, and acetonitrile;

the method of electrically fabricating the nanowire comprising:

electrolytically forming a nano-wire having a diameter of 1 nm to 1 μm and a length of 1 nm to 100 μm by applying a DC voltage and/or an AC voltage having the maximum potential difference across the two electrodes of 10 mV to 20 V across the two electrodes for 0.001 seconds to 10 days in the state wherein the electrolytic solution and the two electrodes are in contact.

2. The method of forming an electrically conductive nanowire according to claim 1, wherein the voltage to be applied is an AC voltage.

* * * * *